United States Patent
Lo et al.

(10) Patent No.: US 12,310,043 B2
(45) Date of Patent: *May 20, 2025

(54) METHOD OF FABRICATING A SEMICONDUCTOR DEVICE

(71) Applicant: TAIWAN SEMICONDUCTOR MANUFACTURING COMPANY, LTD., Hsinchu (TW)

(72) Inventors: Yi-Chen Lo, Zhubei (TW); Li-Te Lin, Hsinchu (TW); Yu-Lien Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 401 days.

This patent is subject to a terminal disclaimer.

(21) Appl. No.: 17/498,645

(22) Filed: Oct. 11, 2021

(65) Prior Publication Data
US 2022/0029002 A1 Jan. 27, 2022

Related U.S. Application Data

(60) Continuation of application No. 16/229,979, filed on Dec. 21, 2018, now Pat. No. 11,145,749, which is a
(Continued)

(51) Int. Cl.
*H10D 30/01* (2025.01)
*H01L 21/02* (2006.01)
(Continued)

(52) U.S. Cl.
CPC ..... *H10D 30/024* (2025.01); *H01L 21/02164* (2013.01); *H01L 21/02211* (2013.01);
(Continued)

(58) Field of Classification Search
CPC ......... H01L 21/02164; H01L 21/02274; H01L 21/02271; H01L 21/02211;
(Continued)

(56) References Cited

U.S. PATENT DOCUMENTS

| | | |
|---|---|---|
| 6,232,188 B1 | 5/2001 | Murtaza et al. |
| 7,202,170 B2 | 4/2007 | Liu et al. |

(Continued)

OTHER PUBLICATIONS

A. Ortiz et al., "Structural Properties of Low Temperature Silicon Oxide Films Prepared by Remote Plasma-Enhanced Chemical Vapor Deposition", Journal of the Electrochemical Society, 1993, vol. 140, issue 10, 2 pgs.

(Continued)

*Primary Examiner* — Michael M Trinh
(74) *Attorney, Agent, or Firm* — STUDEBAKER BRACKETT PLLC

(57) ABSTRACT

A method for fabricating a semiconductor device comprises forming a gate electrode structure over a first region of a semiconductor substrate, and forming a source/drain region on a second region of the semiconductor substrate. The gate electrode structure comprises a metal gate electrode layer, a gate dielectric layer, and gate sidewalls. The second region of the semiconductor substrate is on an opposing side of the metal gate electrode layer. The method for fabricating a semiconductor device further comprises forming an interlayer dielectric layer over the source/drain regions and the gate sidewall, and forming an oxide layer over the source/drain region and the gate sidewall without substantially forming the second oxide layer on the gate electrode layer.

20 Claims, 19 Drawing Sheets

Related U.S. Application Data division of application No. 15/644,600, filed on Jul. 7, 2017, now Pat. No. 10,164,067.

(60) Provisional application No. 62/434,814, filed on Dec. 15, 2016.

(51) Int. Cl.

| | | |
|---|---|---|
| *H01L 21/311* | (2006.01) | |
| *H01L 21/3213* | (2006.01) | |
| *H01L 21/768* | (2006.01) | |
| *H10D 62/13* | (2025.01) | |
| *H10D 64/01* | (2025.01) | |
| *H10D 64/27* | (2025.01) | |
| *H10D 84/01* | (2025.01) | |
| *H10D 84/03* | (2025.01) | |
| H10D 62/40 | (2025.01) | |
| H10D 64/62 | (2025.01) | |

(52) U.S. Cl.
CPC .. *H01L 21/02274* (2013.01); *H01L 21/31144* (2013.01); *H01L 21/32139* (2013.01); *H01L 21/76802* (2013.01); *H01L 21/7685* (2013.01); *H01L 21/76879* (2013.01); *H10D 62/151* (2025.01); *H10D 64/017* (2025.01); *H10D 64/021* (2025.01); *H10D 64/511* (2025.01); *H10D 84/0147* (2025.01); *H10D 84/038* (2025.01); *H10D 62/40* (2025.01); *H10D 64/62* (2025.01); *H10D 84/0149* (2025.01); *H10D 84/0151* (2025.01); *H10D 84/0158* (2025.01)

(58) Field of Classification Search
CPC ........... H01L 21/02214; H01L 21/0223; H01L 21/02252; H01L 29/0847; H01L 29/66545; H01L 29/6656; H01L 29/45; H01L 29/66795; H01L 29/4232; H01L 29/42372; C23C 16/402; H10D 30/024; H10D 30/0273; H10D 62/151; H10D 62/40; H10D 64/017; H10D 64/021; H10D 64/511; H10D 64/62; H10D 64/117; H10D 64/252; H10D 64/2523; H10D 64/2527; H10D 84/0147; H10D 84/038; H10D 84/01; H10D 84/0149; H10D 84/0151; H10D 84/02; H10D 84/032; H10D 84/035; H10D 84/05; H10D 84/07; H10D 84/08; H10D 84/0158; H10D 84/0107; H10D 84/144
See application file for complete search history.

(56) References Cited

U.S. PATENT DOCUMENTS

| | | | |
|---|---|---|---|
| 8,741,775 B2 | 6/2014 | Nemani et al. | |
| 8,815,672 B2* | 8/2014 | Lee | H01L 29/1608 |
| | | | 257/369 |
| 10,164,067 B2* | 12/2018 | Lo | H01L 21/823468 |
| 11,145,749 B2* | 10/2021 | Lo | H01L 29/0847 |
| 2002/0076947 A1* | 6/2002 | Li | H01L 21/31612 |
| | | | 257/E21.279 |
| 2005/0224867 A1 | 10/2005 | Huang et al. | |
| 2008/0122003 A1 | 5/2008 | Fang et al. | |
| 2010/0270627 A1* | 10/2010 | Chang | H01L 29/6659 |
| | | | 438/692 |
| 2013/0137257 A1 | 5/2013 | Wei et al. | |
| 2013/0309856 A1 | 11/2013 | Jagannathan et al. | |
| 2015/0179742 A1* | 6/2015 | Ranade | H01L 29/41766 |
| | | | 438/285 |
| 2016/0240775 A1* | 8/2016 | Hsiao | H10B 63/30 |
| 2016/0284641 A1* | 9/2016 | Liou | H01L 23/5226 |
| 2016/0379873 A1 | 12/2016 | Bu et al. | |
| 2017/0047253 A1 | 2/2017 | Park et al. | |
| 2017/0162675 A1* | 6/2017 | Yim | H01L 21/31058 |
| 2019/0006236 A1* | 1/2019 | Hsieh | H01L 29/41791 |

OTHER PUBLICATIONS

J.C. Alonso et al., "High rate-low temperature deposition of silicon dioxide films by remote plasma enhanced chemical vapor deposition using silicon tetrachloride", Journal of Vacuum Science & Technology, 1995, vol. 13, No. 6, 7 pages.

Non-Final Office Action issued in U.S. Appl. No. 16/229,979, dated Jan. 9, 2020.

Final Office Action issued in U.S. Appl. No. 16/229,979, dated Jul. 27, 2020.

Final Office Action issued in U.S. Appl. No. 16/229,979, dated Oct. 13, 2020.

Non-Final Office Action issued in U.S. Appl. No. 16/229,979, dated Jan. 25, 2021.

Notice of Allowance issued in U.S. Appl. No. 16/229,979, dated Jun. 21, 2021.

\* cited by examiner

US 12,310,043 B2

METHOD OF FABRICATING A SEMICONDUCTOR DEVICE

CROSS-REFERENCE TO RELATED APPLICATIONS

This application is a continuation of application Ser. No. 16/229,979, filed Dec. 21, 2018, now U.S. Pat. No. 11,145,749, which is a divisional of application Ser. No. 15/644,600, filed Jul. 7, 2017, now U.S. Pat. No. 10,164,067, which claims priority to U.S. Provisional Patent Application 62/434,814 filed Dec. 15, 2016, the entire disclosures of each are incorporated herein by reference.

TECHNICAL FIELD

This disclosure is directed to a method of increasing the height of a level of various elements of a semiconductor device during semiconductor device processing.

BACKGROUND

As the semiconductor industry has progressed into nanometer technology process nodes in pursuit of higher device density, higher performance, and lower costs, challenges from both fabrication and design issues have resulted. In particular, increasing device density has produced very high gate heights and gate aspect ratio. High gate height and aspect ratio tends to lead to gate incline or collapse. In addition, as more steps are performed on semiconductor devices to increase device density, gate electrodes are exposed to an increasing number of process steps that can degrade the gate electrode and cause gate electrode height to shrink. If the gate height is too short the device can be damaged during the formation of overlying layers. A method of maintaining proper gate height throughout the semiconductor processing operations is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

To prevent damage to a semiconductor device during semiconductor device fabrication processes, it is important to maintain a proper height of each level of various components of the semiconductor device. Level height can decrease due to semiconductor processing steps, including various etching operations. To counteract level height shrinkage, the height of the gate electrodes or interlayer dielectric layers is increased during semiconductor processing according to some embodiments of the present disclosure.

Figure 1:
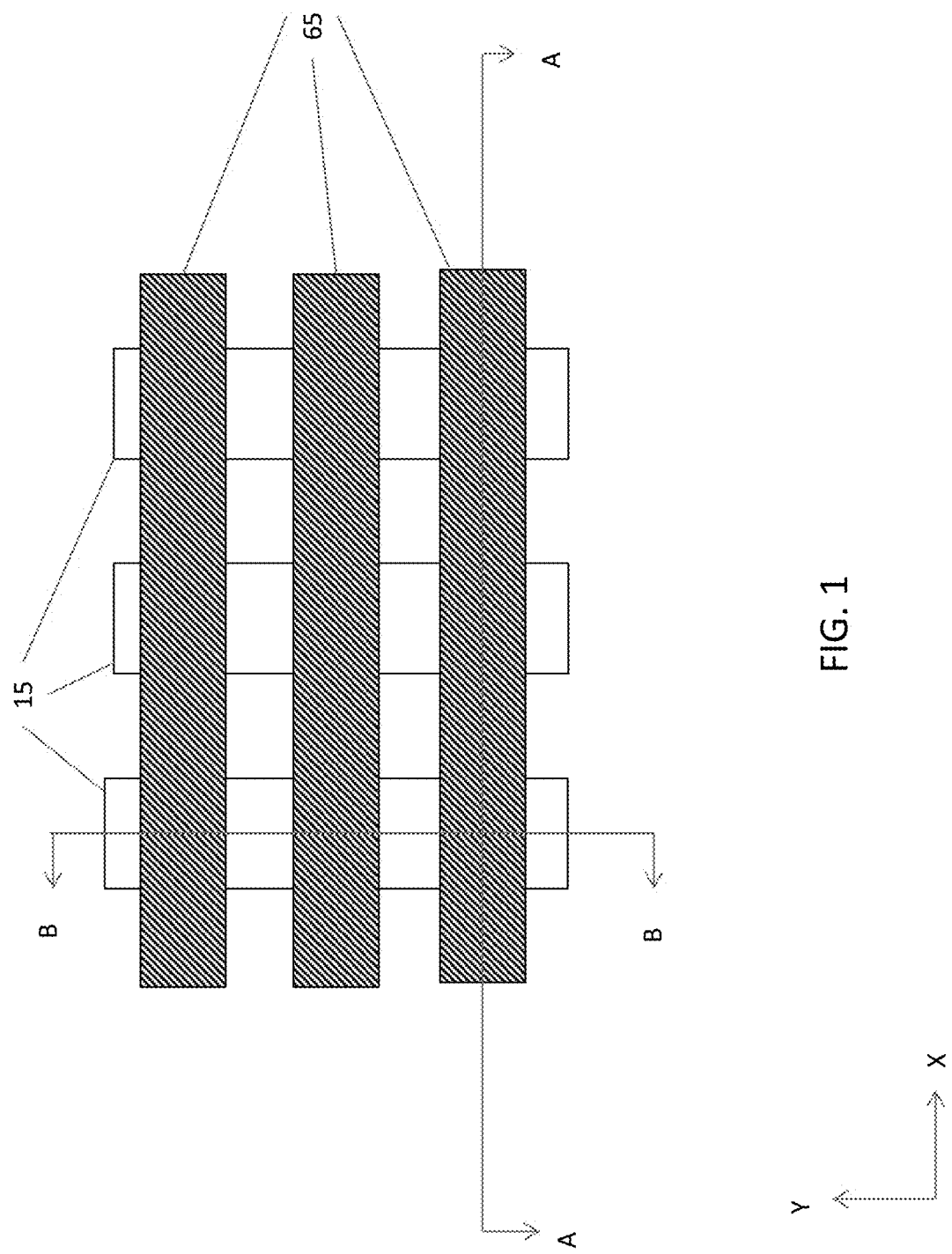
FIG. 1 is a plan view of a semiconductor device according to an embodiment of the present disclosure.
Figure 2:
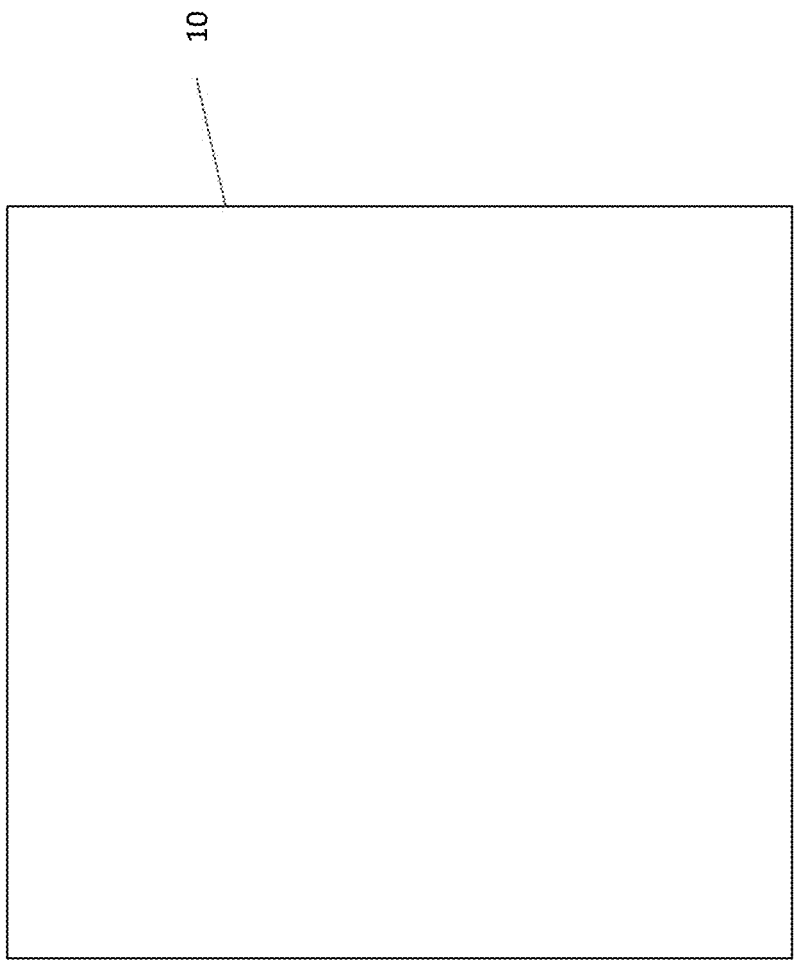
FIG. 2 shows one stage of a sequential process for manufacturing a semiconductor device according to an embodiment of the present disclosure.

FIG. 1 is a plan view of an embodiment of a semiconductor device according to the present disclosure.

FIGS. 2-11 show exemplary sequential processes for manufacturing semiconductor devices according to embodiments of the present disclosure. It is understood that additional operations can be provided before, during, and after processes shown by FIGS. 2-11, and some of the operations described below can be replaced or eliminated, for certain embodiments of the method. The order of the operations/processes may be interchangeable.

A plan view of a semiconductor device is illustrated in FIG. 1. As shown in FIG. 1, a plurality of gate electrode structures 65 are formed overlying a plurality of fin structures 15. Although three fin structures and three gate electrode structures are shown, methods and devices according to the present disclosure may include one, two, four, or more fin structures and one, two, four, or more gate electrode structures.

In some embodiments of the present disclosure, a semiconductor substrate 10 is provided. The substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb, InP, or any combination thereof. In a certain embodiment, the substrate 10 is made of Si.

Figure 3:
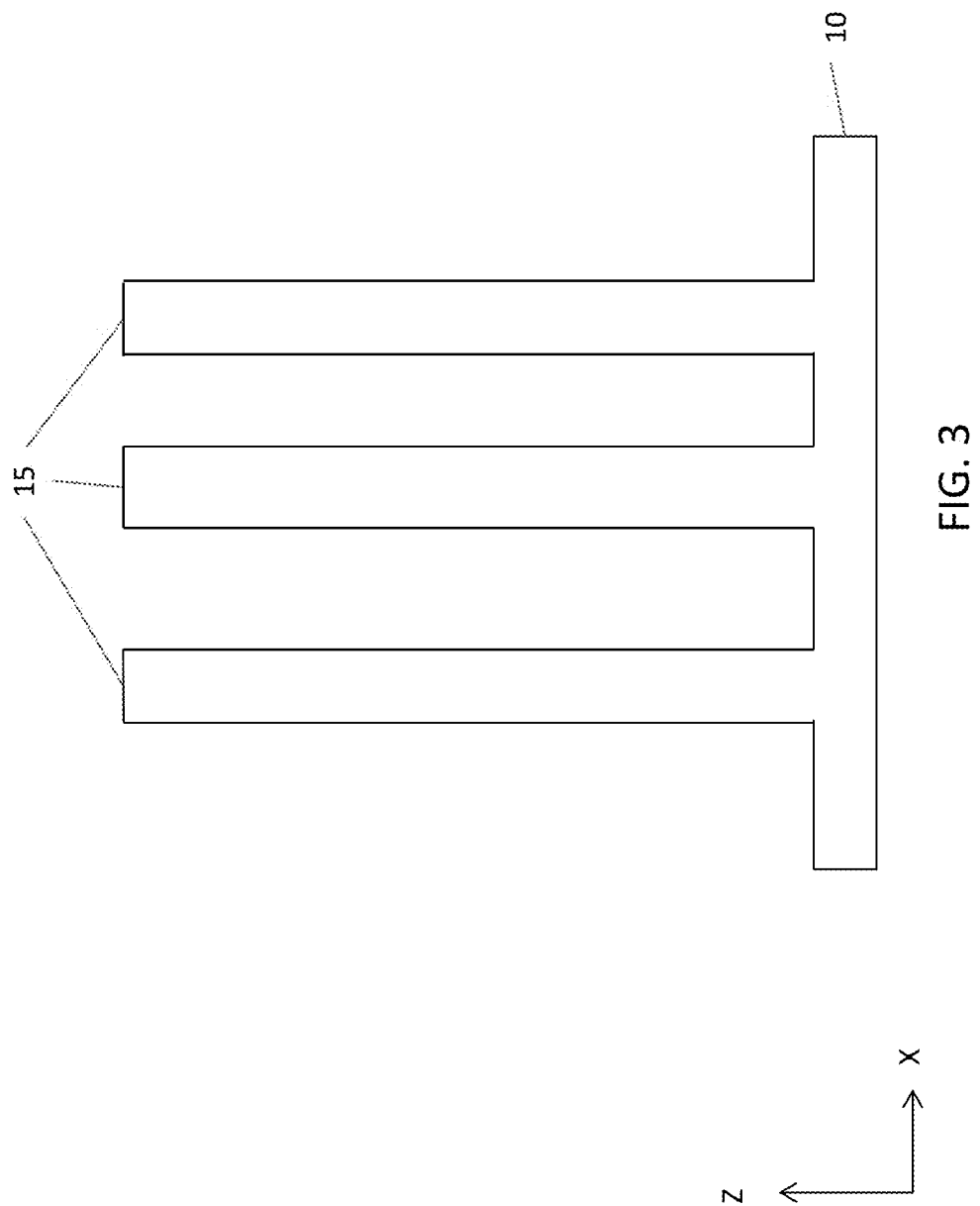
FIG. 3 shows a cross-sectional view taken along line A-A of FIG. 1 of one stage of a sequential process performed on the device of FIG. 2 for manufacturing a semiconductor device according to an embodiment of the present disclosure.

The semiconductor substrate 10 is patterned in some embodiments to form a plurality of fin structures 15, as shown in FIG. 3. The semiconductor substrate 10 is patterned by photolithographic and etching operations in some embodiments. In other embodiments, fin structures 15 are formed on the substrate 10 by semiconductor material deposition operations. As shown in FIG. 1, the fin structures 15 extend in a first direction (e.g., Y direction) and the plurality of fin structures 15 are arranged along a second direction (e.g., X direction) substantially perpendicular to the first direction.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
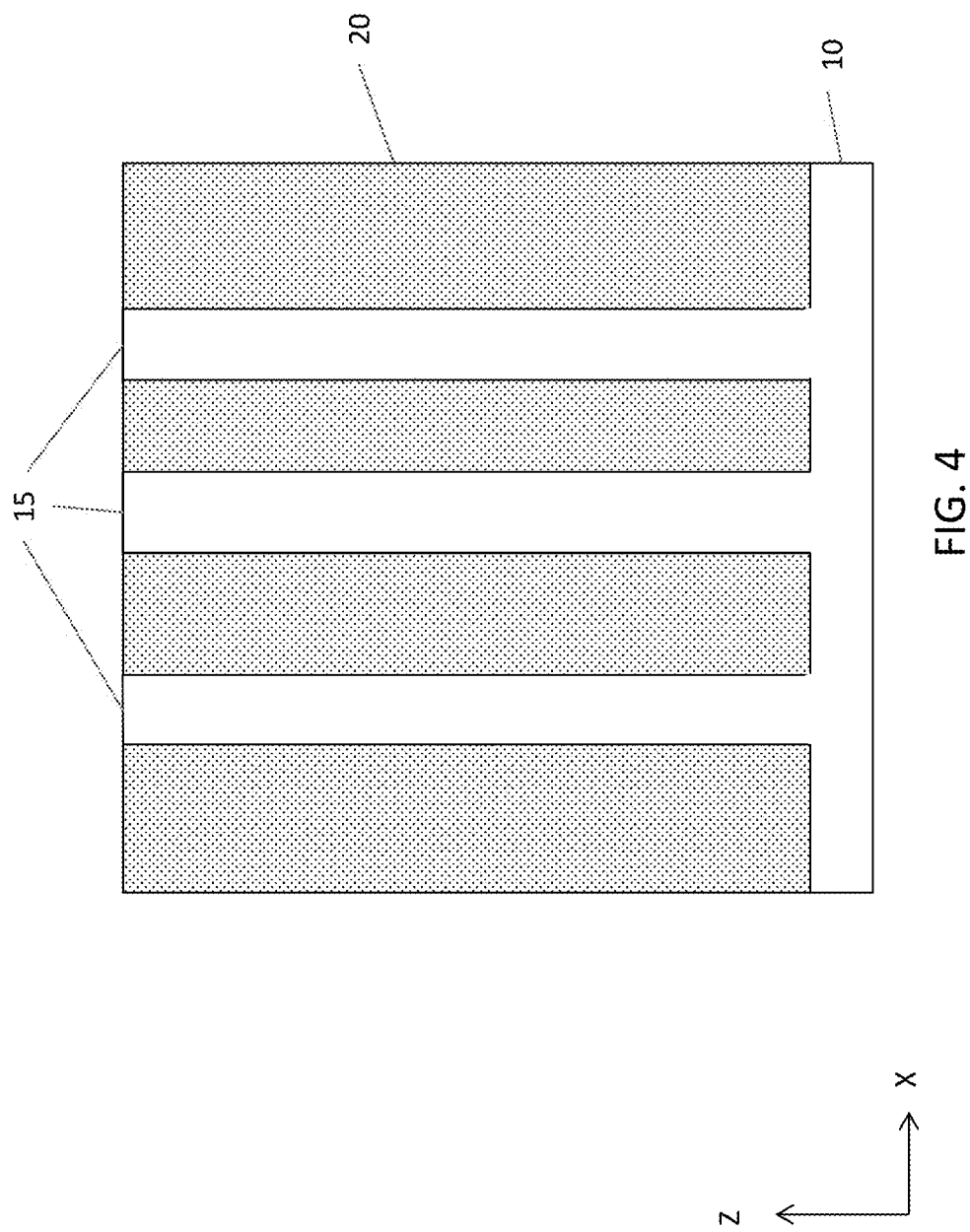
FIG. 4 shows one stage of a sequential process performed on the device of FIG. 3 for manufacturing a semiconductor device according to an embodiment of the present disclosure.

In some embodiments, spaces between fin structures 15 are filled with an isolation insulating layer 20, such as shallow trench isolation regions, as shown in FIG. 4.

The isolation insulating layer 20 includes one or more layers of an insulating material. The insulating material for the insulating layer 20 may include silicon oxide, silicon nitride, silicon oxynitride (SiON), SiOCN, fluorine-doped silicate glass (FSG), a low-k dielectric material, or any other suitable dielectric material formed by low pressure chemical vapor deposition (LPCVD), plasma enhanced chemical vapor deposition (PECVD) or flowable CVD. An anneal operation may be performed after the formation of the isolation insulating layer 20.

Figure 5:
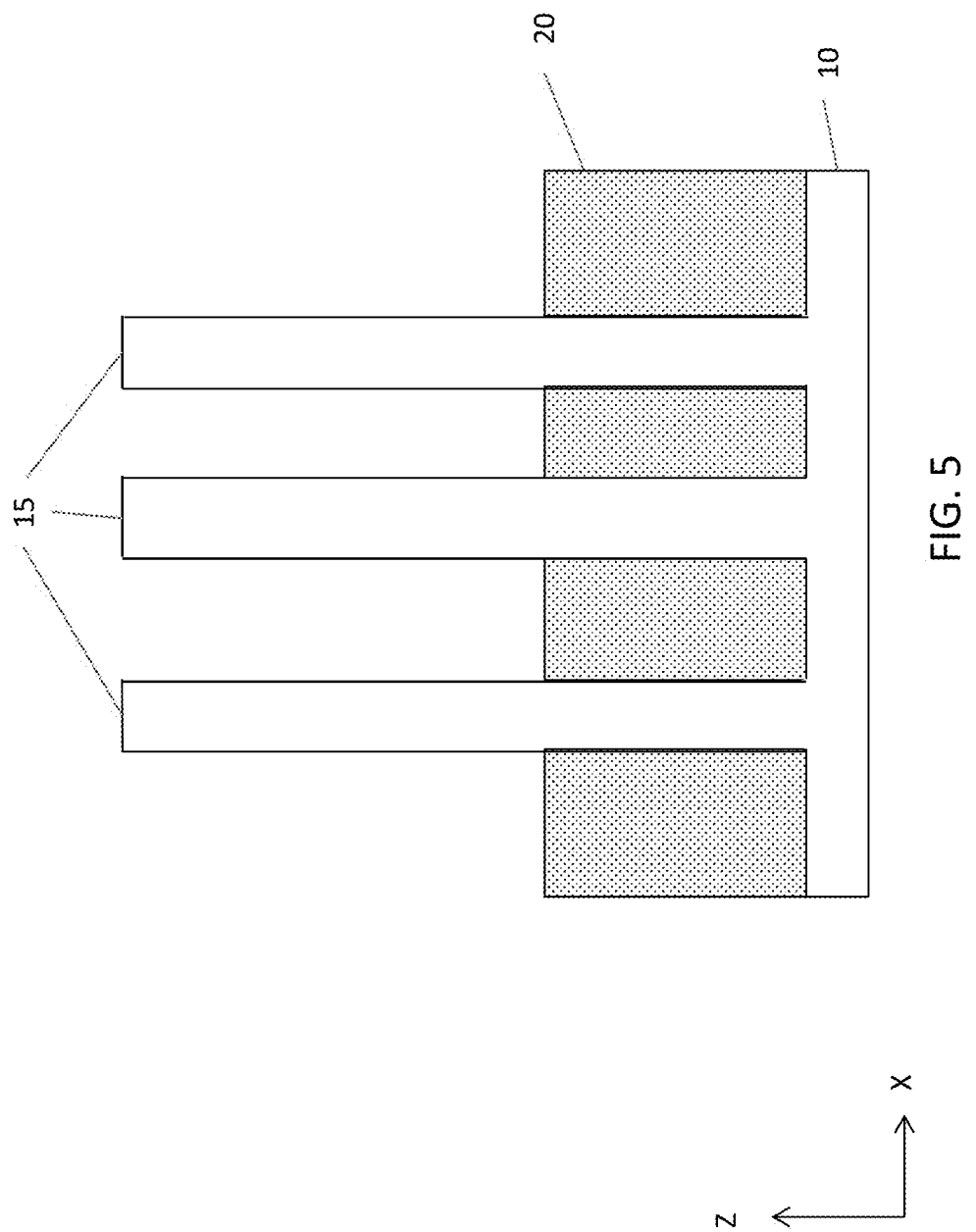
FIG. 5 shows one stage of a sequential process performed on the device of FIG. 4 for manufacturing a semiconductor device according to an embodiment of the present disclosure.

In some embodiments, the isolation insulating material extends over the uppermost surface of the fin structures, and a planarization operation, such as a chemical mechanical polishing (CMP) method and/or an etch-back method, is subsequently performed to remove the upper portion of the isolation insulating layer 20, as shown in FIG. 4. Further, an additional etch-back operation or etching operation is performed to reduce the height of the isolation insulating layer 20 as shown in FIG. 5. Portions of the fin structures 15 protruding from the isolation insulating layer 20 will become the channel region of the semiconductor device, while the portions of the fin structures 15 embedded in the isolation insulating layer 20 will become the well region of the semiconductor device in certain embodiments.

Figure 6:
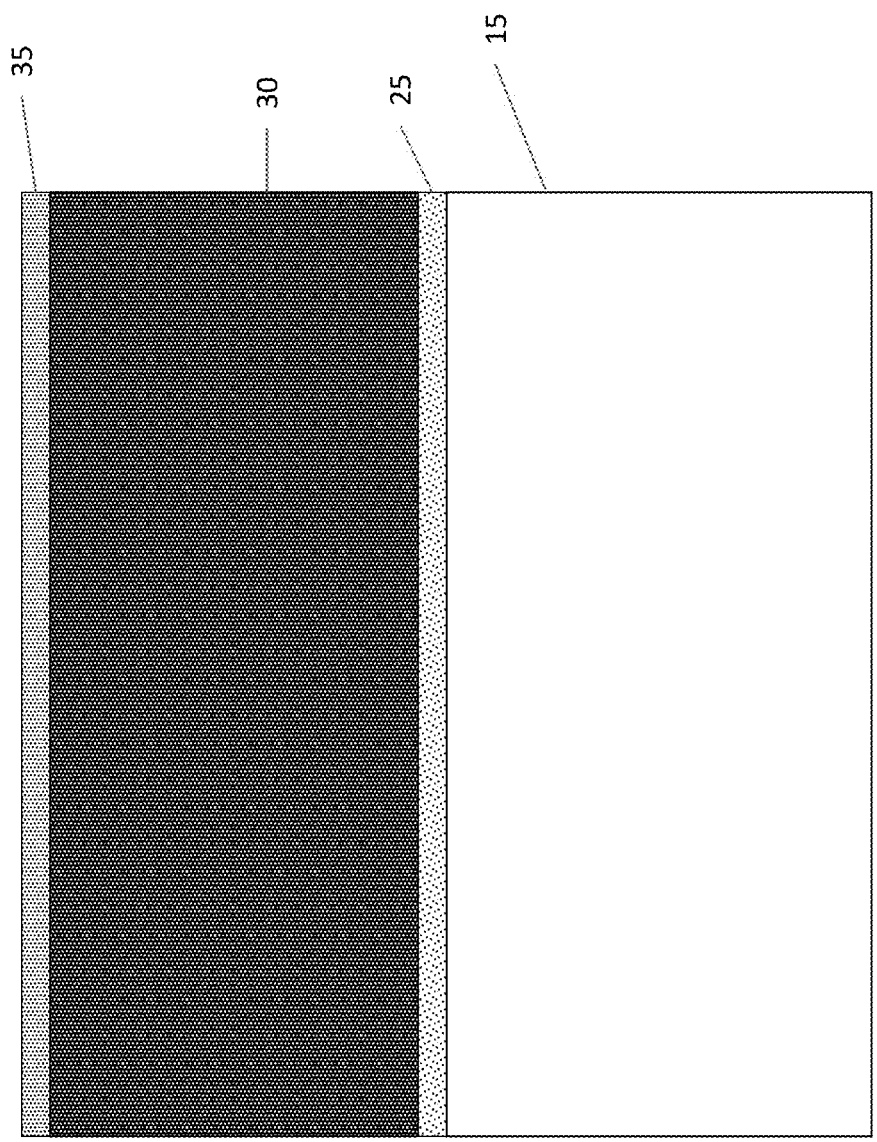
FIG. 6 shows a cross-sectional view taken along line B-B of FIG. 1 of one stage of a sequential process performed on the device of FIG. 5 for manufacturing a semiconductor device according to an embodiment of the present disclosure.

In some embodiments, a gate stack structure is formed on the fin structures 15, as shown in FIG. 6, a cross-sectional view taken along line B-B of FIG. 1. The gate stack structure includes a gate dielectric layer 25 formed on the fin structures 15, a gate electrode layer 30 formed on the gate dielectric layer 25, and a hard mask layer 35 formed on the gate electrode layer 30. In some embodiments, the gate stack structure is a dummy gate stack structure, the gate dielectric layer 25 is a dummy gate dielectric layer, and the gate electrode layer 30 is a dummy gate electrode layer.

In certain embodiments, the gate dielectric layer 25 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 25 includes an interfacial layer (not shown) formed between the fin structures 15 and the dielectric material.

The gate dielectric layer 25 may be formed by CVD, atomic layer deposition (ALD), or any suitable method. The thickness of the gate dielectric layer 25 is in a range from about 1 nm to about 6 nm in some embodiments.

The gate electrode layer 30 is formed on the gate dielectric layer 25. The gate electrode layer 30 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 30 may be formed by CVD, ALD, electroplating, or other suitable method.

In certain embodiments of the present disclosure, one or more work function adjustment layers (not shown) are interposed between the gate dielectric layer 25 and the gate electrode 30. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an nFET, one or more of TaN, TaAlC, TiN, TiC, Co, TiAl, TiSi and TaSi is used as the work function adjustment layer, and for a pFET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the nFET and the pFET, which may use different metal layers.

In some embodiments, when the gate stack is dummy gate stack, the gate dielectric layer 25 is silicon oxide and the gate electrode layer 35 is polysilicon.

The hard mask layer 35 may include one or more layers of silicon nitride or silicon oxide in some embodiments, and may be formed CVD, PVD, ALD, or any other suitable technique.

Figure 7:
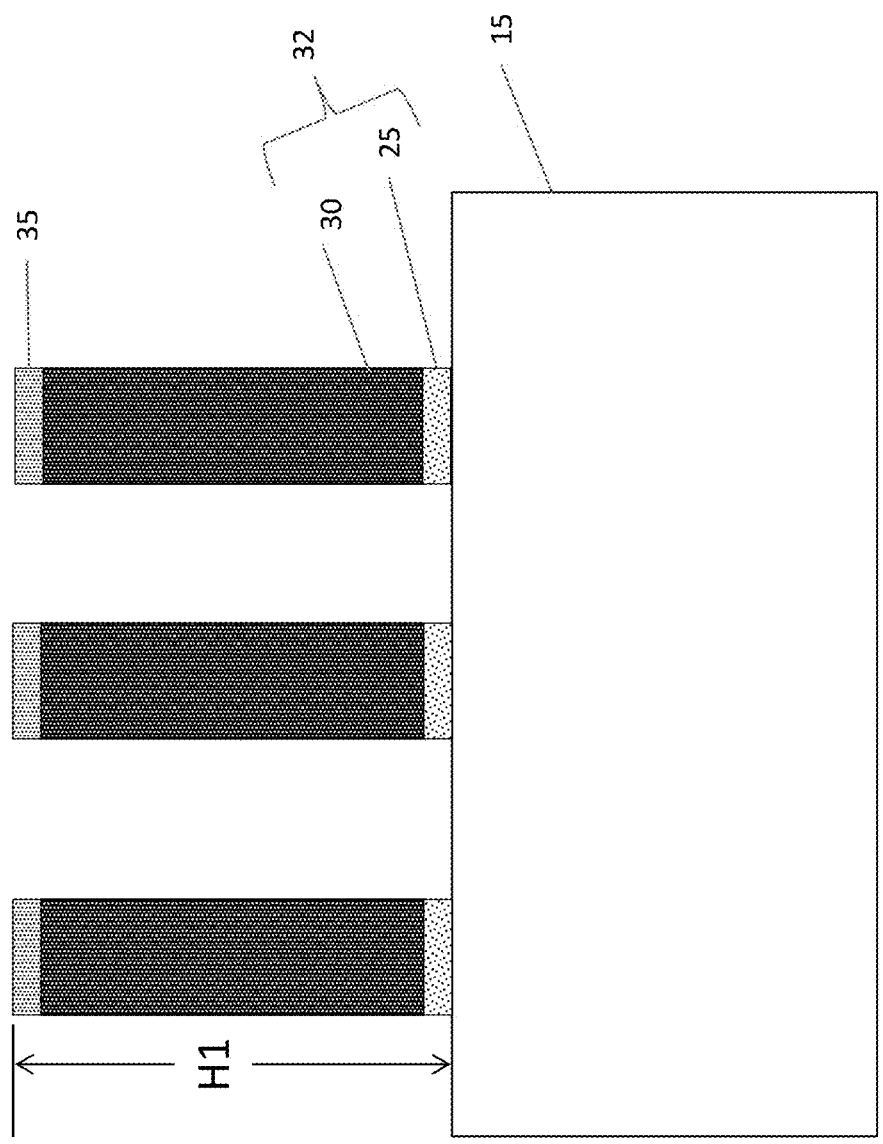
FIG. 7 shows one stage of a sequential process performed on the semiconductor device of FIG. 6 according to an embodiment of the present disclosure.

Gate electrode structures 32 are subsequently formed by patterning the gate stack structure, as shown in FIG. 7. The hard mask layer 35 is patterned using photolithographic and etching techniques, and then the pattern in hard mask is extended through the gate electrode layer 30 and gate dielectric layer 25 exposing the fin structure 15 using an appropriate etching technique, such as anisotropic etching. The gate electrode structures 32 extend along the second direction (X-direction) substantially perpendicular to the first direction (Y-direction) along which the fin structures 15 extend. The gate electrode structures 32 include a gate dielectric layer 25 and a gate electrode layer 30. The gate electrode structure 32 also includes gate sidewalls 45 (see FIG. 10) disposed on opposing sidewalls of the gate electrode 30 and the gate dielectric layer 25, in some embodiments. In some embodiments, the hard mask layer 35 is removed after patterning the gate electrode structures.

In some embodiments, the gate electrode structure 32 has a height H1 measured from the top of the fin structure 15 to an uppermost surface of the gate electrode layer 32 or hard mask layer 35, as shown in FIG. 7. In certain embodiments the height H1 ranges from 30 nm to 300 nm.

Figure 8:
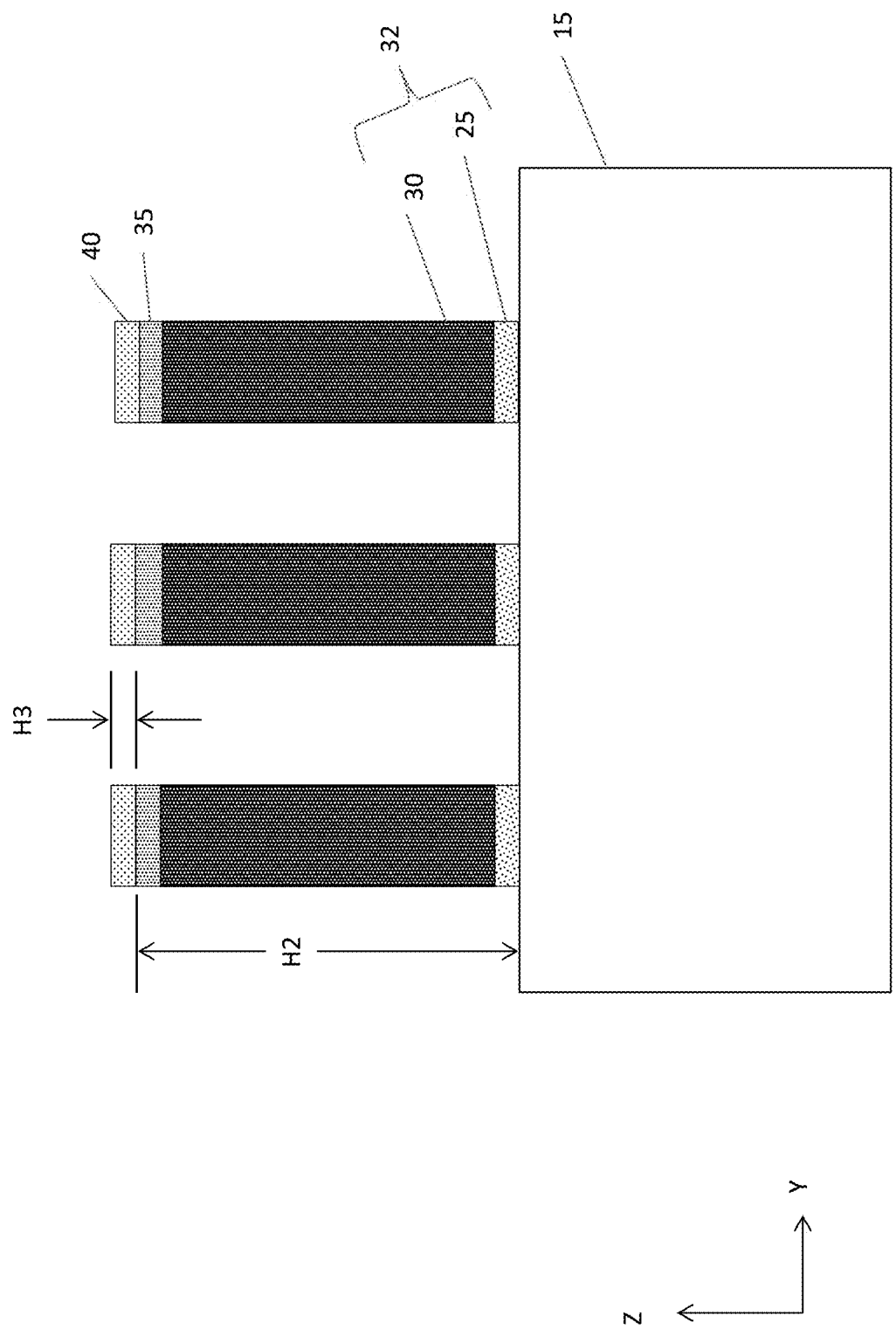
FIG. 8 shows one stage of a sequential process performed on the device of FIG. 7 for manufacturing a semiconductor device according to an embodiment of the present disclosure.

During the course of semiconductor device processing, gate electrode layer height is decreased as a result of various etching operations, such as a polysilicon patterning operation, for example. As shown in FIG. 8, the gate electrode layer 30 and hard mask layer 35 has a height H2 measured from the top of the fin structure 15 to the uppermost surface of the gate electrode layer 30 or hard mask layer 35, wherein height H2<H1. In some embodiments, H2 ranges from about 30 nm to about 290 nm. To increase the height, a silicon oxide layer 40 is subsequently selectively formed on the gate electrode structure 32, as shown in FIG. 8

According to some embodiments of the present disclosure, a silicon oxide deposition operation is performed to increase the gate electrode structure 32 height, thereby forming a silicon oxide layer 40. In certain embodiments, a height H3 of the silicon oxide layer 40 ranges from about 5 nm to about 20 nm. In certain embodiments, (H2+H3)≥H1.

In some embodiments, the gate electrode structure layer 32 height is increased by depositing silicon dioxide formed by a reaction of a silicon halide and oxygen. In certain embodiments, the silicon halide is silicon tetrachloride and the silicon oxide deposition proceeds according to the following formula: $SiCl_4 + O_2 \rightarrow SiO_2 + 2Cl_2$.

The silicon dioxide layer 40 can be deposited at a number of locations during the semiconductor device manufacturing methods. In certain embodiments, the silicon dioxide deposition to increase the level height (interlayer dielectric layer height or gate height) is performed after patterning the gate electrode layer, after a metal gate etch back, or after a self-aligned contact formation.

In some embodiments, the silicon dioxide layer deposition is performed as a plasma deposition at a temperature of ranging from about 55° C. to about 110° C., and a pressure ranging from about 1.9 mT to about 5 mT. A nitrogen carrier gas having a flow rate of about 100 sccm to about 200 sccm is used in certain embodiments. The $SiCl_4$ and $O_2$ flow rates range from about 4 sccm to about 16 sccm in some embodiments. In certain embodiments, the $SiCl_4$ and $O_2$ flow rates are both about 8 sccm. In some embodiments, the ratio of the $SiCl_4$ flow rate to the $O_2$ flow rate ranges from about 4/1 to about 1/100.

Silicon dioxide deposited via the oxidation of silicon tetrachloride according to the present disclosure does not form a conformal coating on the semiconductor device. The silicon dioxide layer 40 is deposited on top surfaces of the gate electrode 30 or hard mask layer 35, or the top surfaces of insulating layers, such as the top surfaces of an interlayer dielectric layer rather than on the sidewalls. Further, silicon dioxide deposited according to the above operation preferentially deposits on surfaces containing oxygen, such as silicon oxides, as compared to depositing on a silicon surface or a metal surface. Because the oxygen plasma oxidizes silicon and metal surface, some silicon dioxide will also deposit on the silicon and metal surfaces. The silicon dioxide deposition according to some embodiments, increases the height of an interlayer dielectric layer without substantially forming an oxide layer over a silicon or a metal surface. The amount of silicon dioxide deposited on the silicon or metal surfaces is about 1/10 to about 1/100 the amount deposited on an interlayer dielectric layer in some embodiments. In some embodiments, the deposition rate of silicon dioxide on a silicon dioxide surface is about 10 times to about 100 times the rate of silicon dioxide deposition on a silicon or metal surface. The silicon dioxide will deposit on a nitride surface, such as a silicon nitride surface at a lower rate than the silicon dioxide will deposit on an oxide surface in some embodiments. The deposition rate of silicon dioxide on a silicon dioxide surface is about the same as to about 3 times greater than that of the rate of deposition on a nitride surface in some embodiments in some embodiments. However, once a silicon dioxide layer 40 is formed on the nitride surface, the rate of silicon dioxide deposition will increase as the later deposited silicon dioxide will be depositing on an oxide surface rather than a nitride surface. Silicon dioxide deposited according to the silicon tetrachloride oxidation operation preferentially deposits on the uppermost acceptable surfaces (oxide surfaces) as compared to lower surfaces, such as in trenches, and between gate structures 32.

In some embodiments, an etchant gas mixture of $Cl_2/NF_3$ is introduced into the $SiCl_4$ and $O_2$ plasma during deposition of silicon dioxide. In some embodiments, silicon dioxide deposition, and etching take place simultaneously. At the upper portions of the device the deposition rate is greater than the etch rate, while at lower portions of the device, such as in trenches between the gates, the etch rate is greater than the silicon dioxide deposition rate. As a result, the small amount of silicon dioxide that is deposited on the lower portions of the device is removed by the etchant. In some embodiments, the flow rate of $Cl_2$ ranges from 8 sccm to 20 sccm and the flow rate of $NF_3$ ranges from 10 sccm to 20 sccm. In certain embodiments the flow rate of $Cl_2$ is 13 sccm and the flow rate of $NF_3$ is 16 sccm. In some embodiments, the ratio of the $Cl_2/NF_3$ flow rates ranges from about 3/1 to about 0 (i.e. —no $Cl_2$ flow).

Figure 9:
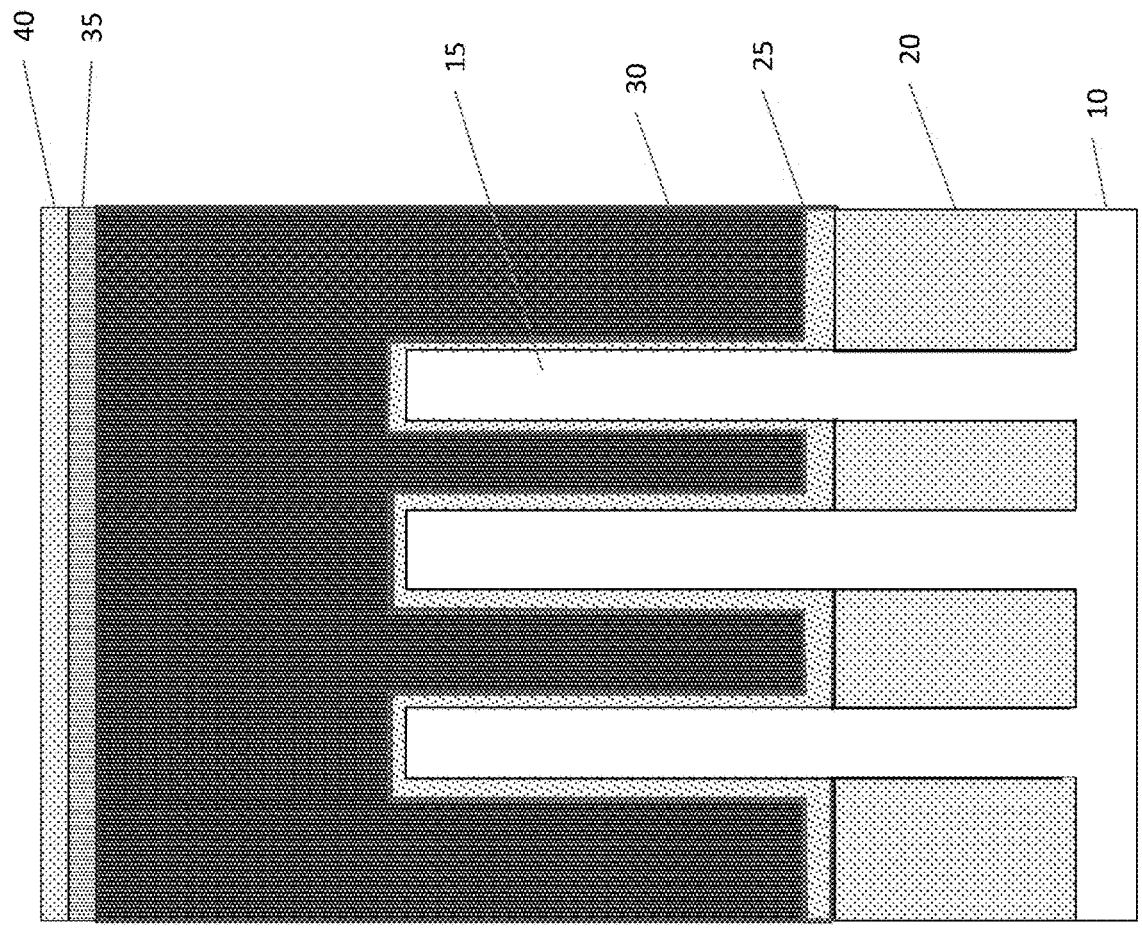
FIG. 9 shows one stage of a cross-sectional view taken along line A-A of FIG. 1 of the semiconductor device of FIG. 8 according to an embodiment of the present disclosure.

FIG. 9 shows a cross sectional view taken along line A-A of FIG. 1 of the gate electrode layer 32 and gate dielectric layer 25 wrapping around the fin structures 15, and the hard mask layer 35 and the silicon oxide layer 40 formed on the gate electrode layer 30.

Figure 10:
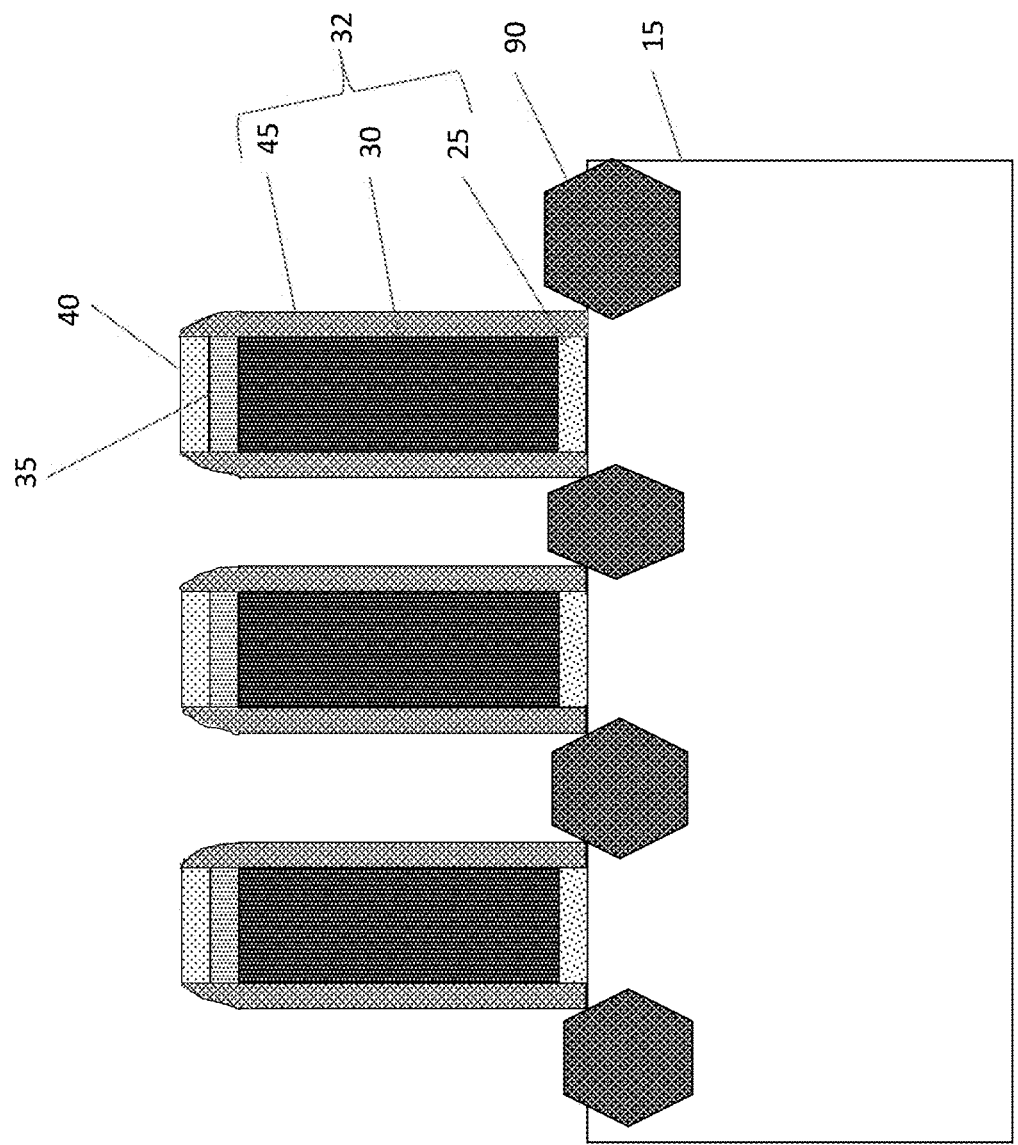
FIG. 10 shows one stage of a cross-sectional view taken along line B-B of FIG. 1 of a sequential process for manufacturing a semiconductor device performed on the device of FIG. 8 according to an embodiment of the present disclosure.

Adverting to FIG. 10, a view along line B-B of FIG. 1, insulating sidewall spacers 45 are formed on the side walls of the gate electrode layers 30, gate dielectric layers 25, hard mask layer 35, and silicon oxide layer 40; and source/drain regions 90 are formed in the fin structures 15 on opposing sides of the gate electrode structures 32. The sidewall spacers 45 may be formed by suitable deposition and etch techniques, and may comprise one or more layers of silicon nitride, silicon oxide, silicon carbide, silicon oxynitride, silicon carbon oxynitride, other suitable materials, or combinations thereof.

A blanket layer of a sidewall insulating material may be formed by CVD, PVD, ALD, or other suitable technique. Then, anisotropic etching is performed on the side-wall insulating material to form a pair of sidewall insulating layers (spacers) 45 on two main sides of the gate electrode 30, gate dielectric layer 25, hard mask layer 35, and silicon oxide layer 40. The thickness of the sidewall spacers 45 is in a range of about 5 nm to about 30 nm in some embodiments, and in a range of about 10 nm to about 20 nm in other embodiments.

Source/drain regions 90 are subsequently formed on opposing sides of the gate electrode structures 32 in some embodiments, as shown in FIG. 10. Source/drain is used in the present disclosure to designate either a source or a drain region. The source/drain regions 90 may be formed by implanting a dopant into the fin structure 15 in some embodiments. The dopant is selected from phosphorus, arsenic, antimony, boron, boron fluoride, aluminum, or gallium in some embodiments. The dopant is implanted in the fin structure at a concentration ranging from $1\times10^{17}$ to $1\times10^{21}$ atoms/cm$^3$ in some embodiments.

In some embodiments, the portions of the fin structures 15 where the source/drain regions 90 are to be formed are recessed or etched, and the source/drain regions 90 are subsequently formed by one or more epitaxy or epitaxial (epi) processes, such that one or more crystalline layers of Si, SiC, SiGe, SiP, SiCP, or Group III-V semiconductor material are formed on the fin structures 15. The crystalline layers are doped with a suitable dopant, as described above. The epitaxy processes include CVD deposition techniques (e.g., vapor-phase epitaxy (VPE) and/or ultra-high vacuum CVD (UHV-CVD)), molecular beam epitaxy, and/or other suitable processes. In other embodiments, the epitaxial source/drain regions 90 are formed without forming a recess.

Figure 11:
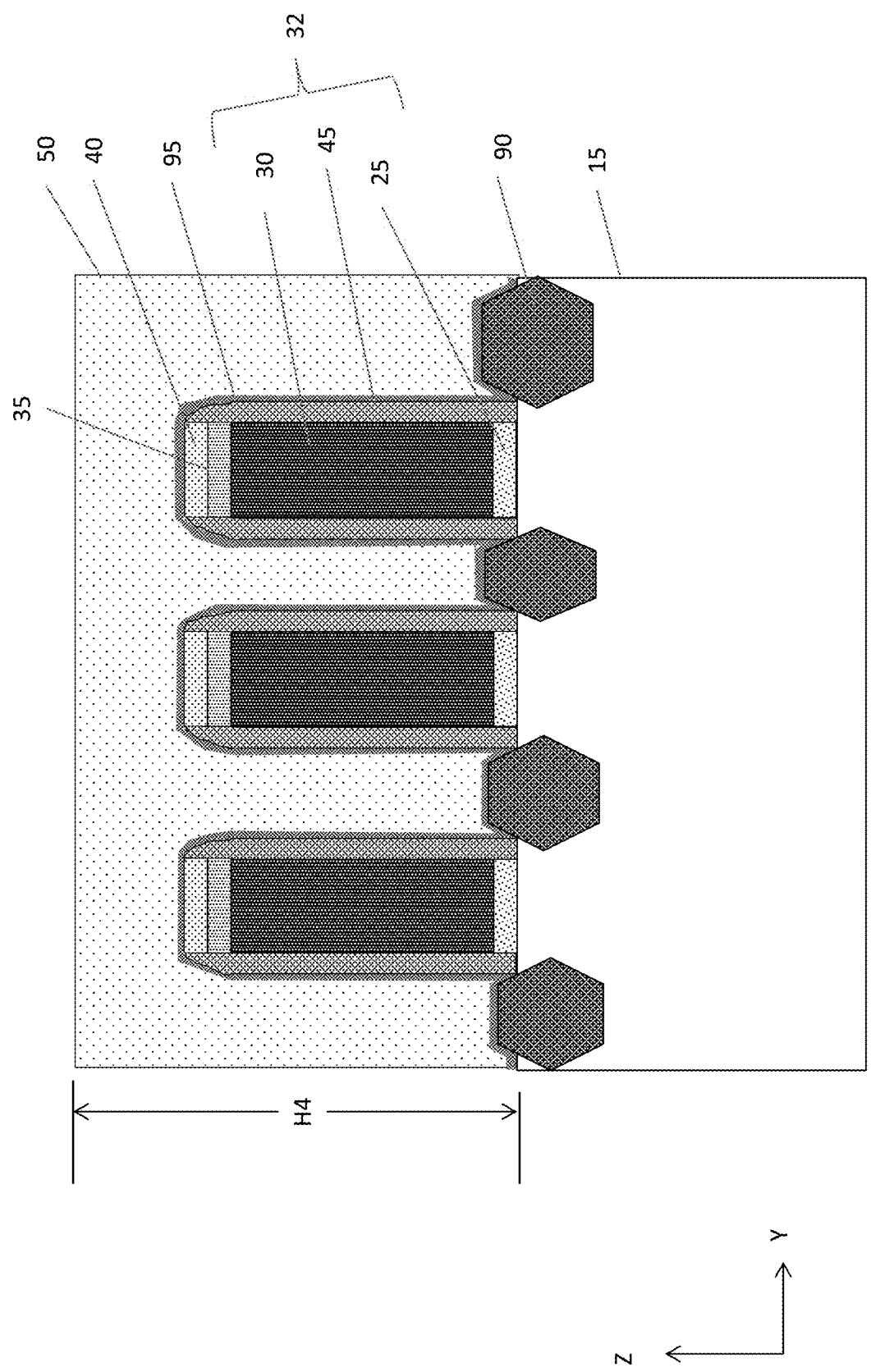
FIG. 11 shows one stage of a sequential process performed on the device of FIG. 10 for manufacturing a semiconductor device according to an embodiment of the present disclosure.

An etch stop layer 95 and an interlayer dielectric layer 50 is formed over the device of FIG. 10, covering the gate electrode structures 32 and source/drain regions 90, as shown in FIG. 11. The interlayer dielectric layer 50 has a height 114 measured from the top surface of the fin structure 15. The height 114 ranges from about 80 nm to about 450 nm in some embodiments. In some embodiments, the etch stop layer 95 includes one or more layers of insulating material, such as silicon nitride based material including SiN, SiCN, and SiOCN. The etch stop layer 95 has a layer thickness in a range from about 3 nm to about 15 nm in some embodiments, and is in a range from about 4 nm to about 8 nm in other embodiments. In some embodiments, the interlayer dielectric layer 50 is an insulating layer made of an insulating material, such as one or more layers of silicon oxide, silicon nitride, a low-k dielectric material or a combination thereof. The interlayer dielectric layer 50 can be formed by CVD. In certain embodiments, the interlayer dielectric layer 50 dielectric is a spin on glass (SOG), including phosphosilicate glass (PSG) or borophosphosilicate glass (BPSG).

FIGS. 12 to 15 show cross-sectional views taken along line B-B of FIG. 1 of a sequential process for manufacturing a semiconductor device according to another embodiment of the present disclosure.

Figure 12:
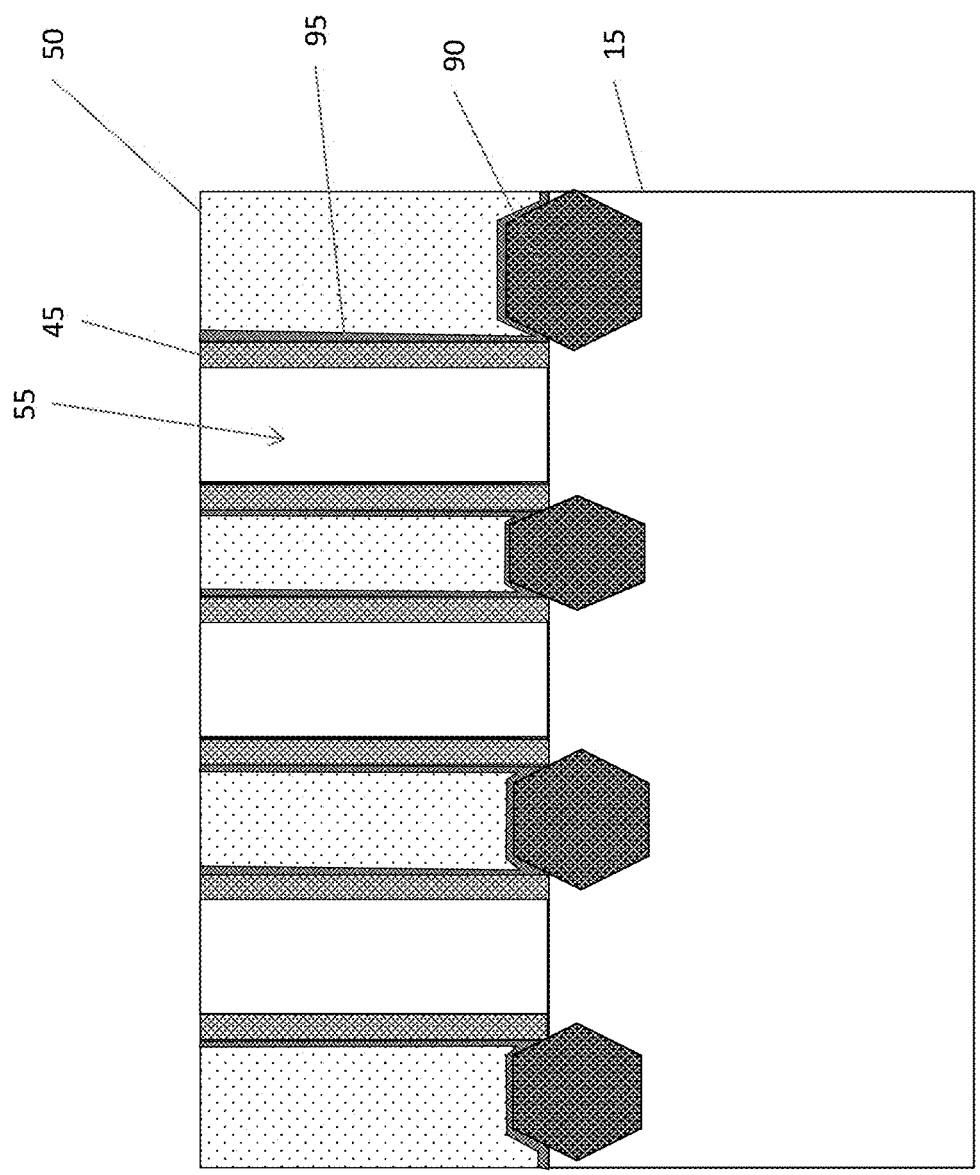
FIG. 12 shows one stage of a sequential process performed on the device of FIG. 11 for manufacturing a semiconductor device according to another embodiment of the present disclosure.

In this embodiment, the gate electrode layers 30 and gate dielectric layers 25 are dummy gate electrode layers and dummy gate dielectric layers. The interlayer dielectric layer 50 is planarized, and hard mask layer 35 and silicon oxide layer 40, if present, are removed, such as by CMP. The dummy gate electrode layers and dummy gate dielectric layers are subsequently removed by photolithographic and etching operations to create gate spaces 55, as shown in FIG. 12.

Figure 13:
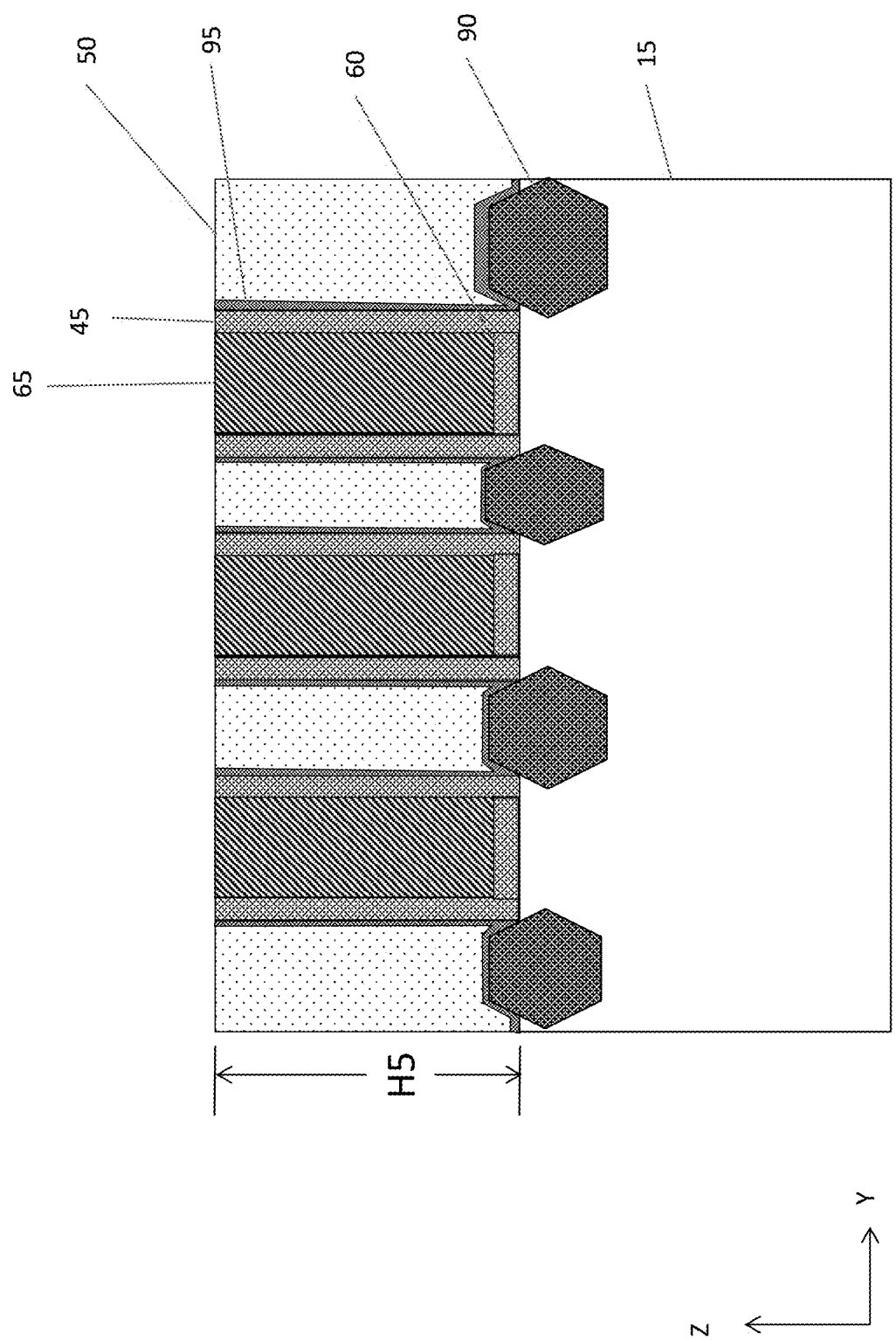
FIG. 13 shows one stage of a sequential process performed on the device FIG. 12 for manufacturing a semiconductor device according to an embodiment of the present disclosure.

A high-k gate dielectric layer 60 and metal gate electrode layer 65 are subsequently formed in the gate spaces 55, as shown in FIG. 13. Examples of high-k dielectric material for the high-k gate dielectric layer 60 include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, or any combination thereof. In some embodiments, the gate dielectric layer 60 includes an interfacial layer (not shown) formed between the fin structure 15 and the gate dielectric layer. The gate dielectric layer 60 may be formed by CVD, ALD, or any suitable method.

The metal gate electrode layer 65 includes one or more layers of a metal, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, or any combination thereof. The metal gate electrode layer 65 may be formed by CVD, ALD, electroplating, or other suitable method.

In certain embodiments of the present disclosure, one or more work function adjustment layers (not shown) are interposed between the gate dielectric layer 60 and the gate electrode layer 65. The work function adjustment layers are made of a conductive material such as a single layer of TiN, TaN, TaAlC, TiC, TaC, Co, Al, TiAl, HfTi, TiSi, TaSi, TiAlC, a multilayer of two or more of these materials, or any combination thereof. The work function adjustment layer may be formed by ALD, PVD, CVD, e-beam evaporation, or other suitable method.

Figure 14:
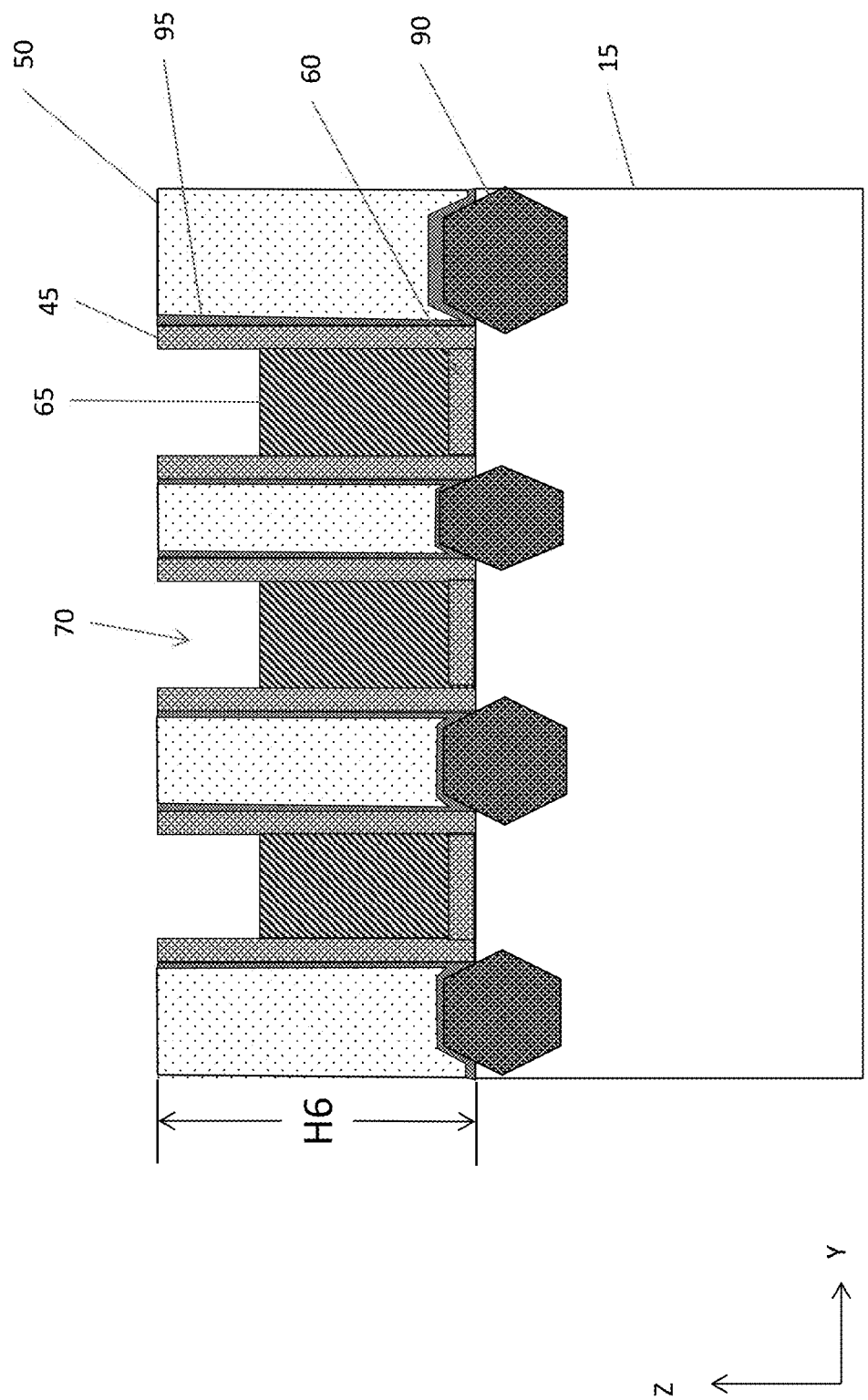
FIG. 14 shows one stage of a sequential process performed on the device of FIG. 13 for manufacturing a semiconductor device according to an embodiment of the present disclosure.

In some embodiments, the metal gate electrode layers 65 are subsequently recess etched in a metal gate etch back operation to form recesses 70, as shown in FIG. 14. After the etch back operation, the interlayer dielectric layer 50 has a height H6 measured from the top surface of the fin structure 15 to the uppermost surface of the interlayer dielectric layer 50. The height H6 of the interlayer dielectric layer 50 ranges from about 70 nm to about 300 nm in some embodiments.

In certain embodiments, the silicon dioxide deposition to increase the level height (interlayer dielectric layer height) is performed after patterning the gate electrode layer, after a metal gate etch back, or after a self-aligned contact formation. For example, interlayer dielectric layer 50 height can be lost during a metal gate etch back operation or during a silicon nitride hard mask removal operation as part of a self-aligned contact formation, so that the height H6 of the interlayer dielectric layer 50 is less than the height H5 (see FIG. 13) before etch back or hard mask removal operations.

Figure 15:
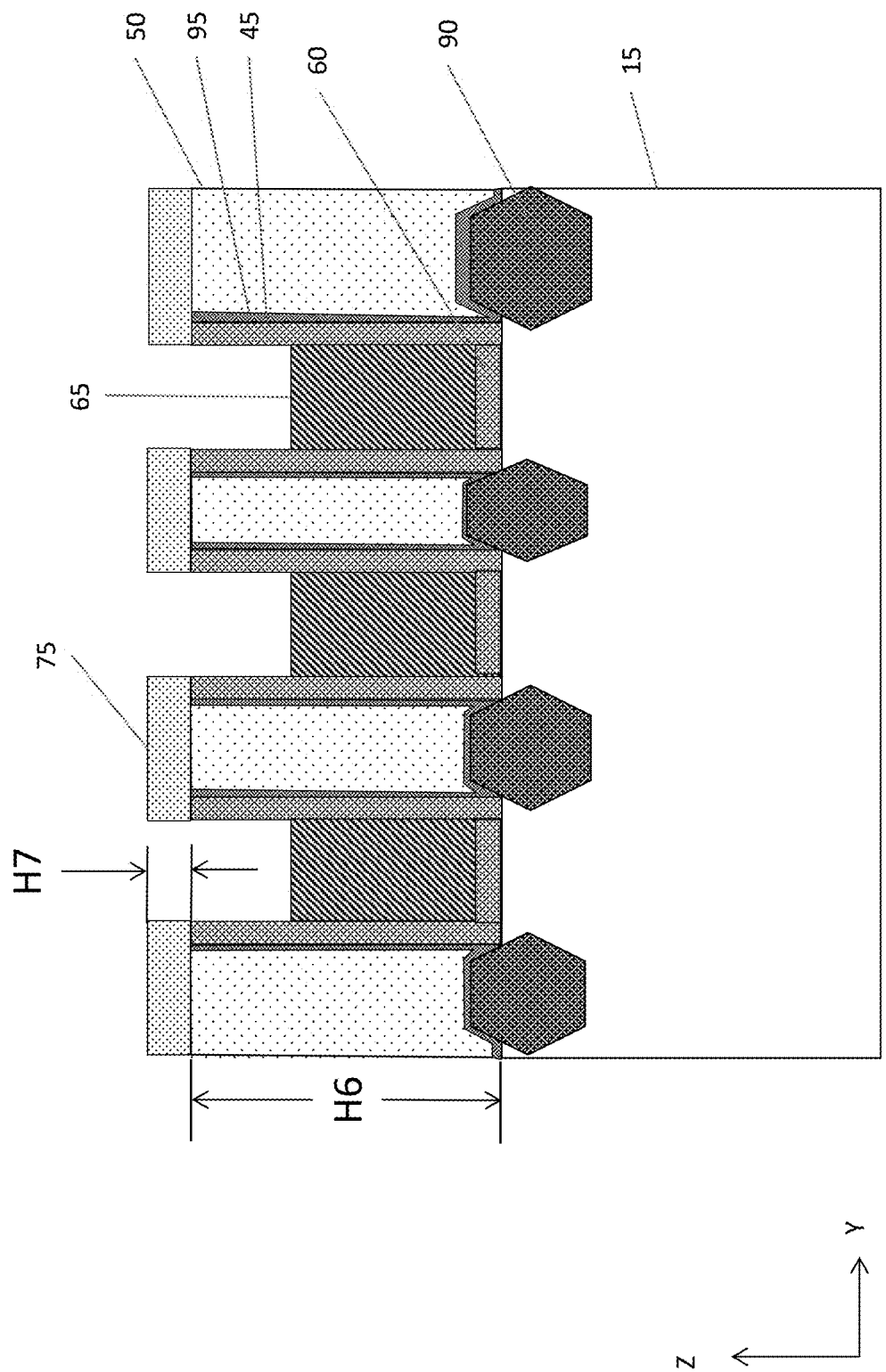
FIG. 15 shows one stage of a sequential process performed on the device of FIG. 14 for manufacturing a semiconductor device according to an embodiment of the present disclosure.

As shown in FIG. 15, the interlayer dielectric layer 50 height is increased in some embodiments by forming a silicon oxide layer 75 on the interlayer dielectric layer 50. In certain embodiments, a height H7 of the silicon oxide layer 75 ranges from about 5 nm to about 20 nm. In certain embodiments, (H6+H7)≥H5.

In some embodiments, the interlayer dielectric layer 50 height is increased by depositing a silicon dioxide layer 75 formed by a reaction of a silicon halide and oxygen. In certain embodiments, the silicon halide is silicon tetrachloride and the silicon oxide deposition proceeds according to the following formula: $SiCl_4+O_2 \rightarrow SiO_2+2Cl_2$.

Silicon dioxide deposited via the oxidation of silicon tetrachloride does not form a conformal coating on the semiconductor device. The silicon dioxide layer 75 is preferentially deposited on top surfaces of the interlayer dielectric layer 50 compared to the top of the metal gate electrodes 65, as shown in FIG. 15. The silicon dioxide deposition according to some embodiments, increases the height of the interlayer dielectric layer 50 without substantially forming an oxide layer over the metal gate electrode 65. The amount of silicon dioxide deposited on the top of the metal gate electrodes is about 1/10 to about 1/100 the amount deposited on an interlayer dielectric layer in some embodiments. In some embodiments, the deposition rate of silicon dioxide on a silicon dioxide surface is about 10 times to about 100 times the rate of silicon dioxide deposition on the top of the metal gate electrodes.

Figure 16:
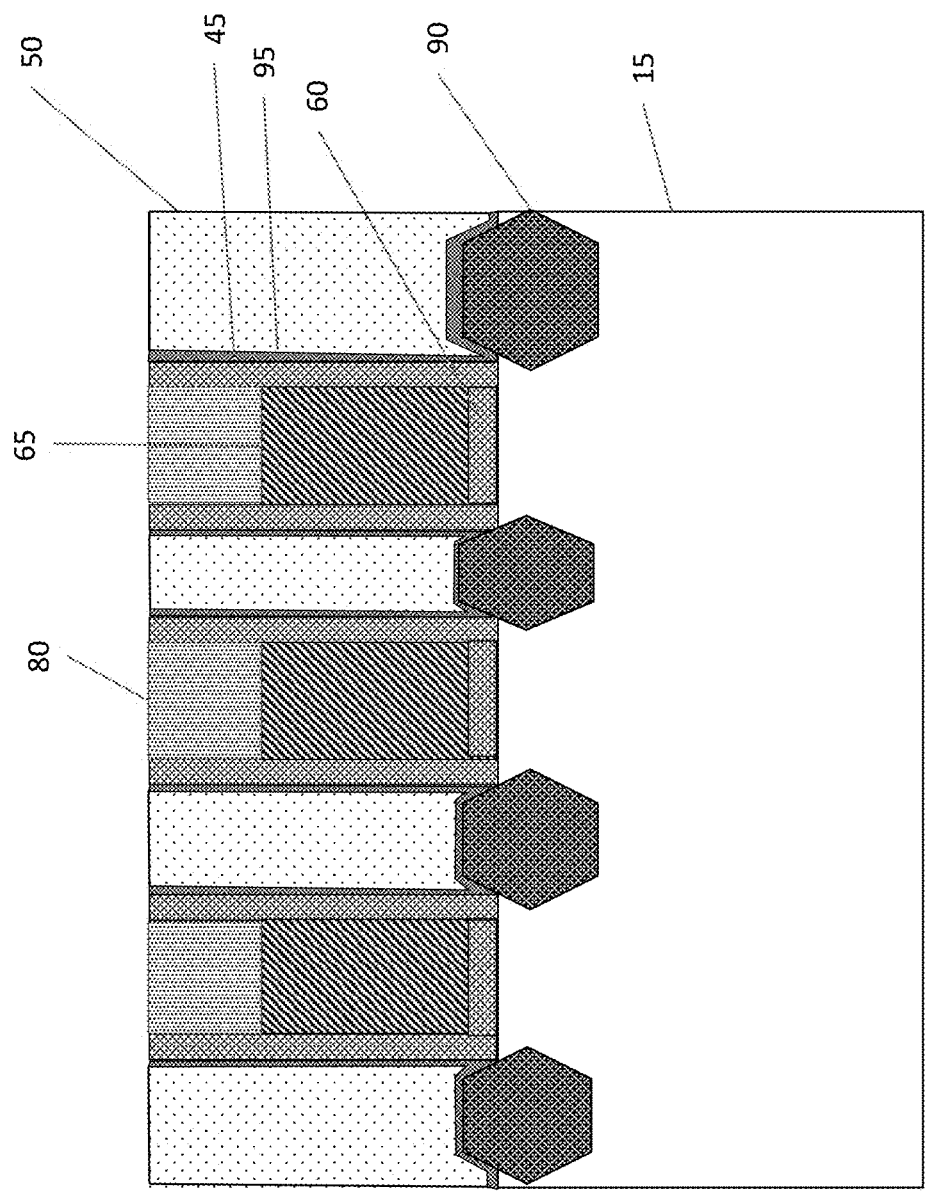
FIG. 16 shows one stage of a sequential process performed on the device of FIG. 14 for manufacturing a semiconductor device according to an embodiment of the present disclosure.

FIGS. 16-19 show a cross-sectional views taken along line B-B of FIG. 1 of a sequential process for manufacturing a semiconductor device according to another embodiment of the present disclosure. In some embodiments, a cap insulating layer 80 is formed over the recessed metal gate electrode layers 65 of FIG. 14, as shown in FIG. 16. The cap insulating layer 80 includes one or more layers of insulating material such as silicon nitride based material including SiN, SiCN, and SiOCN. The cap insulating layer 80 may be formed by CVD, physical vapor deposition (PVD) including sputtering, atomic layer deposition (ALD), or other suitable film forming methods. In some embodiments, the cap insulating layer 80 layer is formed over the interlayer dielectric layer 50 and a planarization operation, such as an etch-back process and/or a chemical mechanical polishing (CMP) process, is performed, thereby obtaining the structure of FIG. 16. The thickness of the cap insulating layer 80 is in a range from about 10 nm to about 250 nm in some embodiments, and is in a range from about 15 nm to about 80 nm in other embodiments. The cap insulating layer 80 is formed as part of a self aligned contact formation operation in some embodiments.

Figure 17:
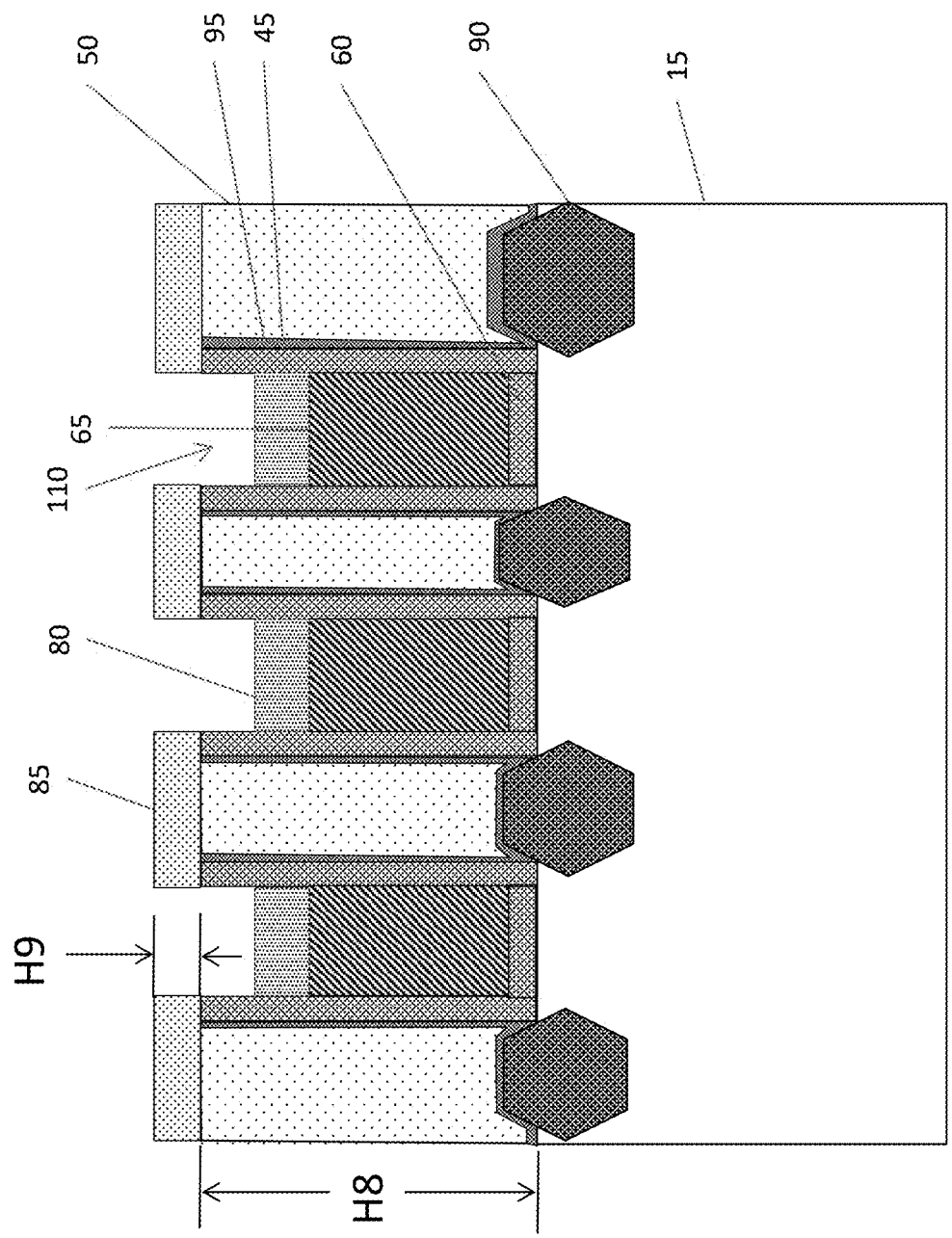
FIG. 17 shows one stage of a sequential process performed on the device of FIG. 16 for manufacturing a semiconductor device according to an embodiment of the present disclosure.

As shown in FIG. 17, the cap insulating layer 80 is subsequently recessed etch to form a recess 110 in some embodiments. The interlayer dielectric layer 50 may suffer height reduction because of the various etching operations, providing a height H8, wherein H8<H5. Therefore, the interlayer dielectric layer 50 height is increased in some embodiments by forming a silicon oxide layer 85 on the interlayer dielectric layer 50. In certain embodiments, a height H9 of the silicon oxide layer 85 ranges from about 5 nm to about 20 nm. In certain embodiments, (H8+H9)≥H5.

In some embodiments, the interlayer dielectric layer 50 height is increased by depositing silicon dioxide formed by a reaction of a silicon halide and oxygen. In certain embodiments, the silicon halide is silicon tetrachloride and the silicon oxide deposition proceeds according to the following formula: $SiCl_4+O_2 \rightarrow SiO_2+2Cl_2$. The silicon dioxide will deposit on a nitride surface, such as the cap insulating layer 80, at a lower rate than the silicon dioxide will deposit on an oxide surface in some embodiments. The deposition rate of silicon oxide on a silicon oxide surface is about the same as to about 3 times greater than that of the rate of deposition on the cap insulating layer 80 in some embodiments.

Figure 18:
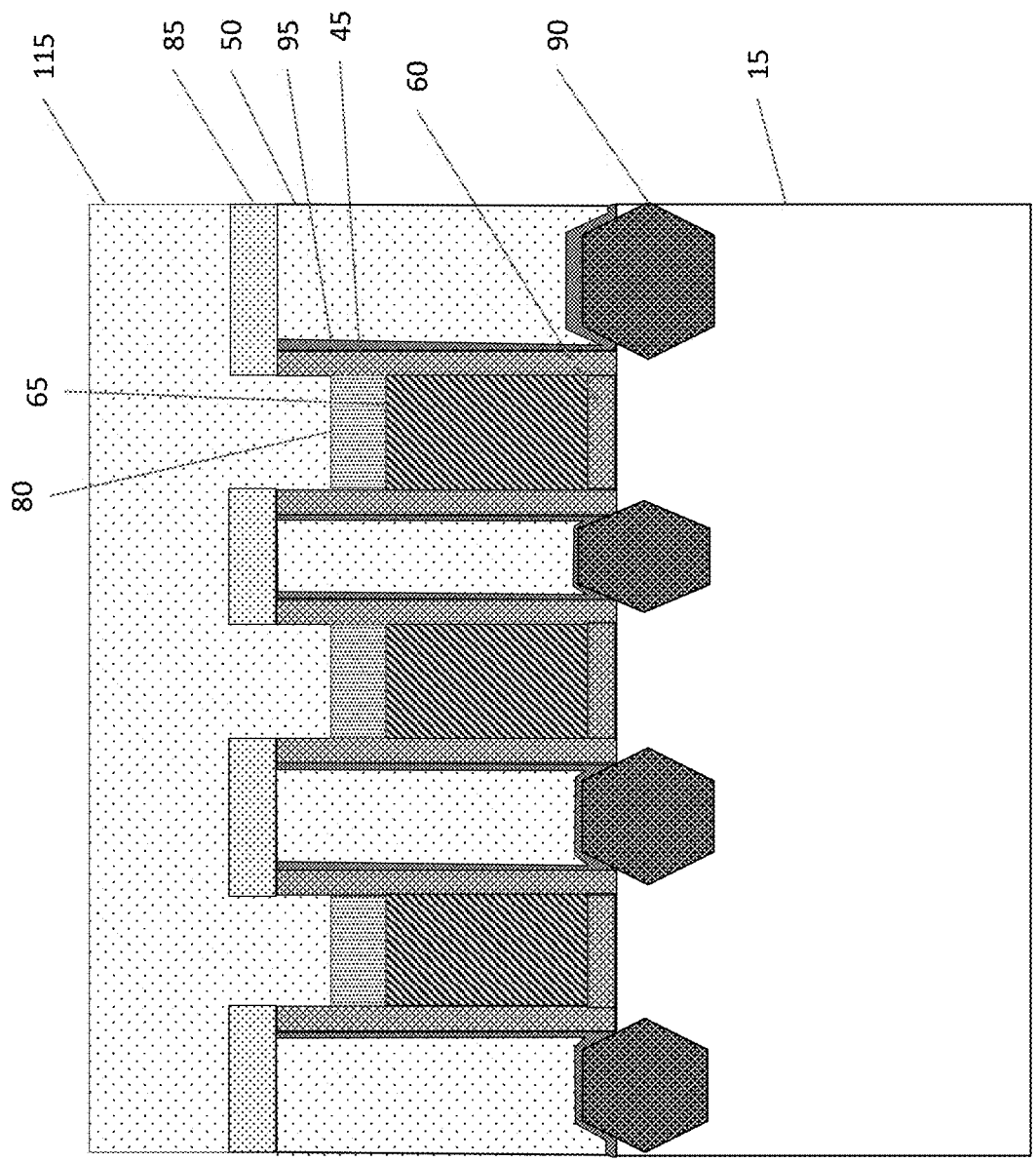
FIG. 18 shows one stage of a sequential process performed on the device of FIG. 17 for manufacturing a semiconductor device according to another embodiment of the present disclosure.

Adverting to FIG. 18, a second interlayer dielectric layer H5 is subsequently formed over the device of FIG. 17. In some embodiments, the second interlayer dielectric layer H5 is an insulating layer made of an insulating material, such as one or more layers of silicon oxide, silicon nitride, a low-k dielectric material or a combination thereof. The interlayer dielectric layer H5 can be formed by CVD. In certain embodiments, the interlayer dielectric layer H5 dielectric is a spin on glass (SOG), including phosphosilicate glass (PSG) or borophosphosilicate glass (BPSG).

Figure 19:
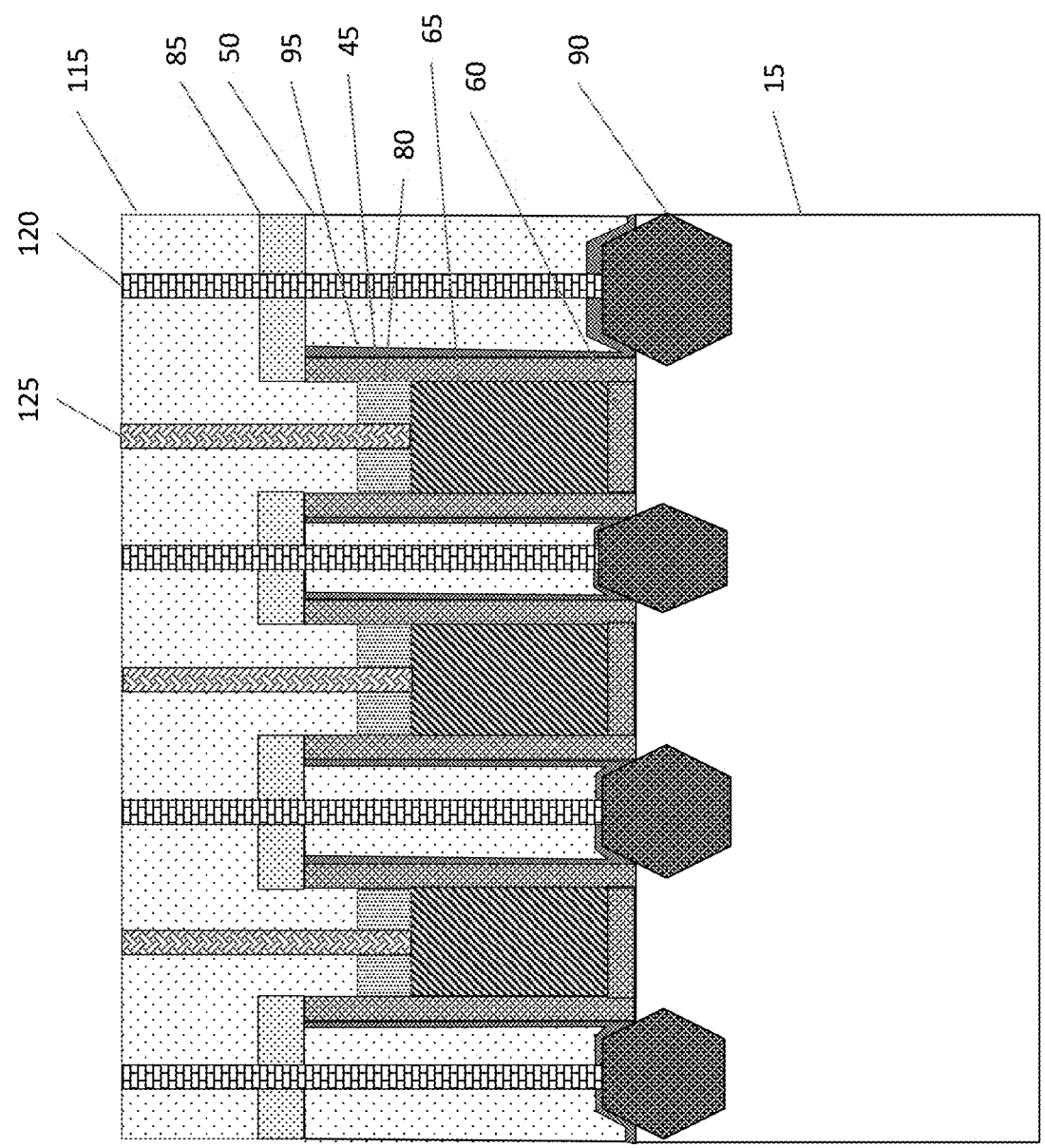
FIG. 19 shows one stage of a sequential process performed on the device of FIG. 18 for manufacturing a semiconductor device according to an embodiment of the present disclosure.

In some embodiments, vias are subsequently formed in the interlayer dielectric layers 50, H5 by using suitable photolithographic and etching operations. Using suitable material deposition techniques, source/drain contacts 120 are formed in some vias providing electric contact to the source/drain regions 90, and gate electrode contacts 125 are formed in some vias providing electrical contact to the gate electrode layers 65, as shown in FIG. 19. In some embodiments, a contact barrier liner layer (not shown) is formed in the vias prior to forming the contacts 120, 125. In some embodiments, the contact barrier liner layer is formed of a metal nitride, such as TaN or TiN. The contact barrier liner layer may be formed by ALD, PVD, CVD, or other suitable process. In some embodiments, the contacts 120, 125 are formed of aluminum, copper, titanium, tantalum, tungsten, cobalt, molybdenum, nickel, alloys thereof, and other suitable conductive materials. The contacts 120, 125 may be formed by CVD, ALD, electroplating, or other suitable methods.

It is understood that the semiconductor devices undergo further fabrication processes to form various features such as contacts/vias, interconnect metal layers, dielectric layers, passivation layers, etc. Additional operations performed on the semiconductor device may include photolithography, etching, chemical-mechanical polishing, thermal treatments, including rapid thermal annealing, depositions, doping, including ion-implantation, photoresist ashing, and liquid solvent cleaning.

The present disclosure provides a method to increase gate electrode structure or interlayer dielectric layer height. Certain semiconductor processing operations, such as patterning of a gate electrode layer, metal gate etch back, and self-aligned contact formation can result in a loss of gate electrode or interlayer dielectric. In certain embodiments, the silicon dioxide deposition to increase the level height (interlayer dielectric layer height or gate height) is performed after patterning the gate electrode layer, after a metal gate etch back, or after a self-aligned contact formation to restore the original heights of the gate electrode or interlayer dielectric layer, and thereby increase the yield of the semiconductor manufacturing process.

The present disclosure helps prevent polysilicon collapse of high aspect ratio gate electrodes. The present disclosure also eliminates the need for a surface modification technique using a surfactant to prevent polysilicon collapse of high aspect ratio gate electrodes, and the resultant need to remove the surfactant after the surface modification technique.

It will be understood that not all advantages have been necessarily discussed herein, no particular advantage is required for all embodiments or examples, and other embodiments or examples may offer different advantages.

An embodiment of the present disclosure is a method for fabricating a semiconductor device, including forming a gate electrode structure over a first region of a semiconductor substrate, and selectively forming an oxide layer overlying the gate electrode structure by reacting a halide compound with oxygen to increase a height of the gate electrode structure. In an embodiment, the halide compound is silicon tetrachloride. In an embodiment, the oxide layer is silicon dioxide. In an embodiment, a height of the oxide layer overlying the gate electrode structure is about 5 nm to about 20 nm. In an embodiment, before forming the gate electrode structure, the method includes patterning the substrate to form a fin extending in a first direction, and forming the gate electrode structure overlying the fin and extending in a second direction substantially perpendicular to the first direction. In an embodiment, the method includes forming source/drain regions on second regions of the semiconductor substrate, wherein the second regions of the semiconductor substrate are on opposing sides of the gate electrode structure. In an embodiment, the forming the gate electrode structure includes forming a gate dielectric layer overlying the substrate, forming a gate electrode layer overlying the gate dielectric layer, forming a hard mask layer overlying the gate electrode layer, patterning the hard mask layer to form a patterned hard mask, and removing portions of the gate electrode layer and gate dielectric layer not covered by the hard mask. In an embodiment, the oxide layer is formed overlying the hard mask.

Another embodiment of the present disclosure is a method for fabricating a semiconductor device, including forming a dummy gate electrode structure over a region of a semiconductor substrate. An insulating layer is formed over the dummy gate electrode structure, and the dummy gate electrode structure is removed. A gate electrode structure is formed over the region of the semiconductor substrate where the dummy gate electrode structure was removed. An oxide layer is formed overlying the insulating layer by reacting a halide compound with oxygen to increase a height of the insulating layer without substantially forming an oxide layer over the gate electrode structure. In an embodiment, the halide compound is silicon tetrachloride. In an embodiment, the oxide layer is silicon dioxide. In an embodiment, a height of the oxide layer overlying the insulating layer is about 5 nm to about 20 nm. In an embodiment, the gate electrode structure includes a high k gate dielectric layer and a metal gate electrode formed over the high k gate dielectric layer. In an embodiment, the method includes performing an etch back of the metal gate electrode before forming the oxide layer on the insulating layer.

Another embodiment of the present disclosure is a method for fabricating a semiconductor device, including forming a dummy gate electrode structure over a region of a semiconductor substrate. A first insulating layer is formed over the dummy gate electrode structure, and the dummy gate electrode structure is removed. A gate electrode structure is formed over the region of the semiconductor substrate where the dummy gate electrode structure was removed. A second insulating layer is formed over the gate electrode structure. An oxide layer is formed overlying the first insulating layer by reacting a halide compound with oxygen to increase a height of the insulating layer without substantially forming an oxide layer over the second insulating layer. A via is formed in the first insulating layer and the second insulating layer exposing the gate electrode structure. A conductive material is deposited in the via to form gate electrode contacts. In an embodiment, the halide compound is silicon tetrachloride. In an embodiment, the oxide layer is silicon dioxide. In an embodiment, the gate electrode structure includes a high k gate dielectric layer and a metal gate electrode formed over the high k gate dielectric layer. In an embodiment, the method includes recessing the metal gate electrode before forming the second insulating layer on the gate electrode structure. In an embodiment, the second insulating layer is a nitride layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a gate electrode structure over a first region of a semiconductor substrate, wherein the gate electrode structure comprises a metal gate electrode layer, a gate dielectric layer, and first and second gate sidewalls;
    forming a source/drain region on a second region of the semiconductor substrate, wherein the second region of the semiconductor substrate is on an opposing side of the metal gate electrode layer;
    forming an interlayer dielectric layer over the source/drain region and the first and second gate sidewalls; and
    forming an oxide layer over the interlayer dielectric layer, source/drain region, and uppermost surfaces of the first and second gate sidewalls without substantially forming the oxide layer on the metal gate electrode layer,
    wherein a first outermost edge of the oxide layer is flush with a first outermost edge of the first gate sidewall and a second outermost edge of the oxide layer is flush with a second outermost edge of the second gate sidewall when viewed in cross section.

2. The method according to claim 1, wherein the metal gate electrode layer includes a plurality of metal layers.

3. The method according to claim 1, wherein the interlayer dielectric layer is made of one or more layers of silicon oxide, silicon nitride, or a combination thereof.

4. The method according to claim 1, wherein the oxide layer is silicon dioxide.

5. The method according to claim 4, wherein the oxide layer is formed by a reaction of a silicon halide and oxygen.

6. The method according to claim 4, wherein the oxide layer has a height of about 5 nm to about 20 nm.

7. A method for fabricating a semiconductor device, comprising:
forming a fin structure over a semiconductor substrate, wherein the fin structure extends in a first direction;
forming a gate electrode structure over the fin structure, wherein the gate electrode structure extends in a second direction substantially perpendicular to the first direction, and the gate electrode structure includes first and second gate sidewalls;
forming a source/drain region in the fin structure on opposing sides of the gate electrode structure;
forming an oxide layer over uppermost surfaces of the first and second gate sidewalls and over the source/drain region without substantially forming the oxide layer over the gate electrode structure, wherein a first outermost edge of the oxide layer is flush with a first outermost edge of the first gate sidewall and a second outermost edge of the oxide layer is flush with a second outermost edge of the second gate sidewall when viewed in cross section;
forming an insulating layer over the gate electrode structure;
forming an interlayer dielectric layer over the insulating layer and the oxide layer;
forming a via in the interlayer dielectric layer and the oxide layer exposing the source/drain region; and
depositing a conductive material in the via to form a source/drain contact.

8. The method according to claim 7, wherein the gate electrode structure includes a metal gate electrode layer.

9. The method according to claim 8, wherein the metal gate electrode layer is formed by chemical vapor deposition, atomic layer deposition, or electroplating.

10. The method according to claim 7, wherein the insulating layer includes one or more layers formed by SiN, SiCN, or SiOCN.

11. The method according to claim 7, wherein the interlayer dielectric layer is formed by chemical vapor deposition.

12. The method according to claim 7, wherein the source/drain contact is formed of aluminum, copper, titanium, tantalum, tungsten, cobalt, molybdenum, nickel, and alloys thereof.

13. The method according to claim 7, wherein a contact barrier liner layer is formed in the via prior to forming the source/drain contact.

14. A method for fabricating a semiconductor device, comprising:
forming a fin structure over a semiconductor substrate, wherein the fin structure extends in a first direction;
forming a gate electrode structure over a first region of the fin structure, wherein the gate electrode structure includes a metal gate electrode layer, the gate electrode structure extends in a second direction substantially perpendicular to the first direction, and first and second sidewalls of the gate electrode structure are surrounded by a first interlayer dielectric layer;
recessing the metal gate electrode layer to form a recessed metal gate electrode layer;
forming an oxide layer over the first interlayer dielectric layer and over uppermost surfaces of the first and second sidewalls of the gate electrode structure by reacting a halide compound with oxygen, wherein a first outermost edge of the oxide layer is flush with a first outermost edge of the first sidewall and a second outermost edge of the oxide layer is flush with a second outermost edge of the second sidewall when viewed in cross section; and
forming a second interlayer dielectric layer over the oxide layer.

15. The method according to claim 14, wherein the metal gate electrode layer is recessed by a metal gate etch back operation.

16. The method according to claim 14, wherein the halide compound is silicon halide.

17. The method according to claim 14, wherein the oxide layer is silicon dioxide.

18. The method according to claim 14, wherein the oxide layer has a height of about 5 nm to about 20 nm.

19. The method according to claim 14, wherein the second interlayer dielectric layer is formed by chemical vapor deposition.

20. The method according to claim 14, wherein the first and second interlayer dielectric layers are made of one or more layers of silicon oxide, silicon nitride, or a combination thereof.

* * * * *